(12) United States Patent
Neiger et al.

(10) Patent No.: US 6,407,893 B1
(45) Date of Patent: *Jun. 18, 2002

(54) ARC FAULT DETECTOR WITH CIRCUIT INTERRUPTER AND EARLY ARC FAULT DETECTION

(75) Inventors: Benjamin B. Neiger, New York; Roger M. Bradley, North Bellmore; James N. Pearse, Dix Hills; William J. Rose, Woodbury, all of NY (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/677,801

(22) Filed: Oct. 2, 2000

Related U.S. Application Data

(63) Continuation of application No. 08/993,745, filed on Dec. 19, 1997, now Pat. No. 6,128,169.

(51) Int. Cl.[7] ................................................. H02H 9/08
(52) U.S. Cl. ......................... 361/42; 324/520; 324/525
(58) Field of Search ............................ 361/42–50, 63, 361/78, 79, 88, 91.1, 93.1, 99.111, 93.2, 93.5, 93.6; 324/508, 509, 512, 520, 525; 702/58, 134, FOR 103, FOR 104, FOR 105, FOR 107

(56) References Cited

U.S. PATENT DOCUMENTS

| | | | |
|---|---|---|---|
| 4,466,071 A | * 8/1984 | Russell, Jr. | 361/44 |
| 5,459,630 A | * 10/1995 | MacKenzie et al. | 361/45 |
| 5,715,125 A | * 2/1998 | Neiger et al. | 361/42 |
| 6,128,169 A | * 10/2000 | Neiger et al. | 361/42 |

* cited by examiner

Primary Examiner—Ronald W. Leja
(74) Attorney, Agent, or Firm—Paul J. Sutton

(57) ABSTRACT

An arc fault detector comprised as a stand alone unit and in combination with a ground fault circuit interrupter (GFCI) functions to provide protection from potentially dangerous arc fault conditions. When combined with a GFCI, the combination arc fault/ground fault circuit interrupter (AFCI/GFCI) provides protection from both arc fault and ground fault conditions. A single transformer is used to detect faults between neutral and ground and arc faults. An impedance splits the current flow into two portions so as to generate differential current proportional to the current flowing through the conductors. An early arcing detector periodically tests the AC line for high impedance between the device and a main breaker panel. The AFCI/GFCI device detects both AC line frequencies and high frequencies associated with arcing. Both average and instantaneous values of both AC line frequency and high frequency arcing signals are processed to generate an arc fault signal. The device allows the arc detector to differentiate between destructive high level arcing and low level arcing such as generated by typical household appliances and equipment. This serves to decrease the occurrence of false tripping. The device also includes a timer circuit, which permits the user to temporarily disable the arc detector, and includes communication means to permit the device to communicate the occurrence and location of the arc fault to a centralized monitoring station.

25 Claims, 19 Drawing Sheets

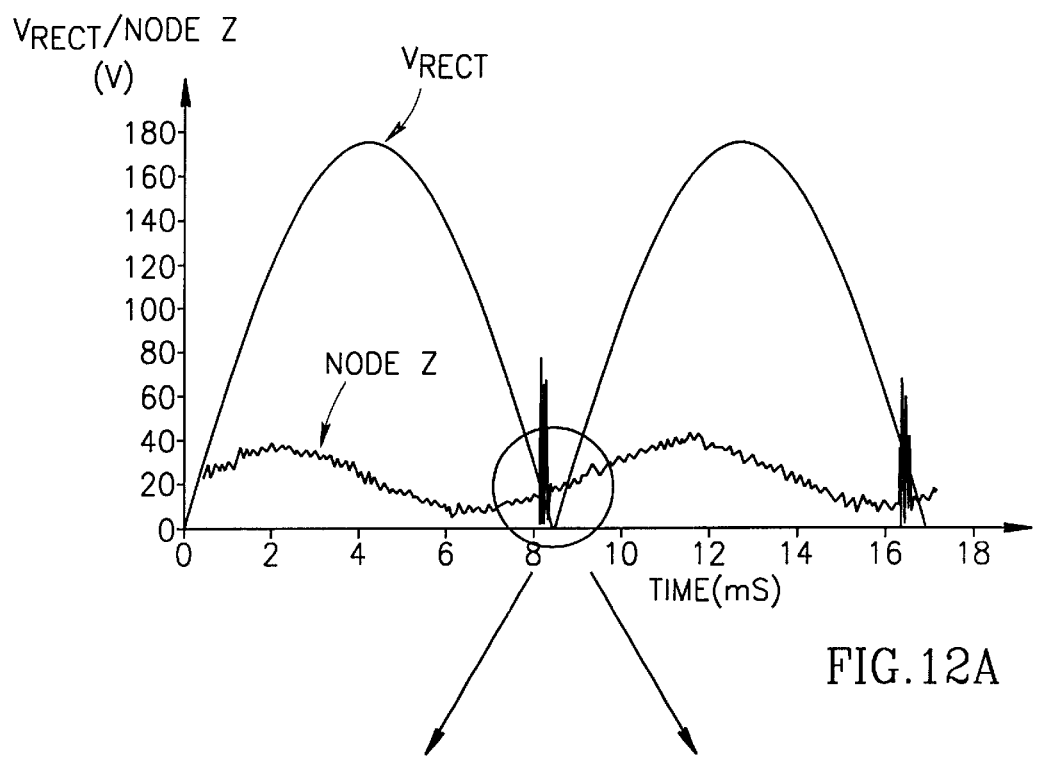
FIG. 12A
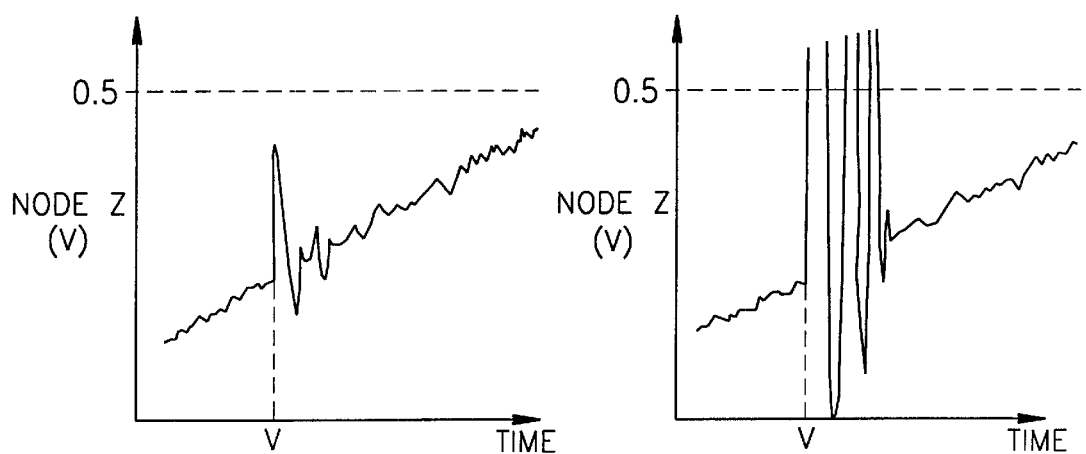
FIG. 12B
FIG. 12C

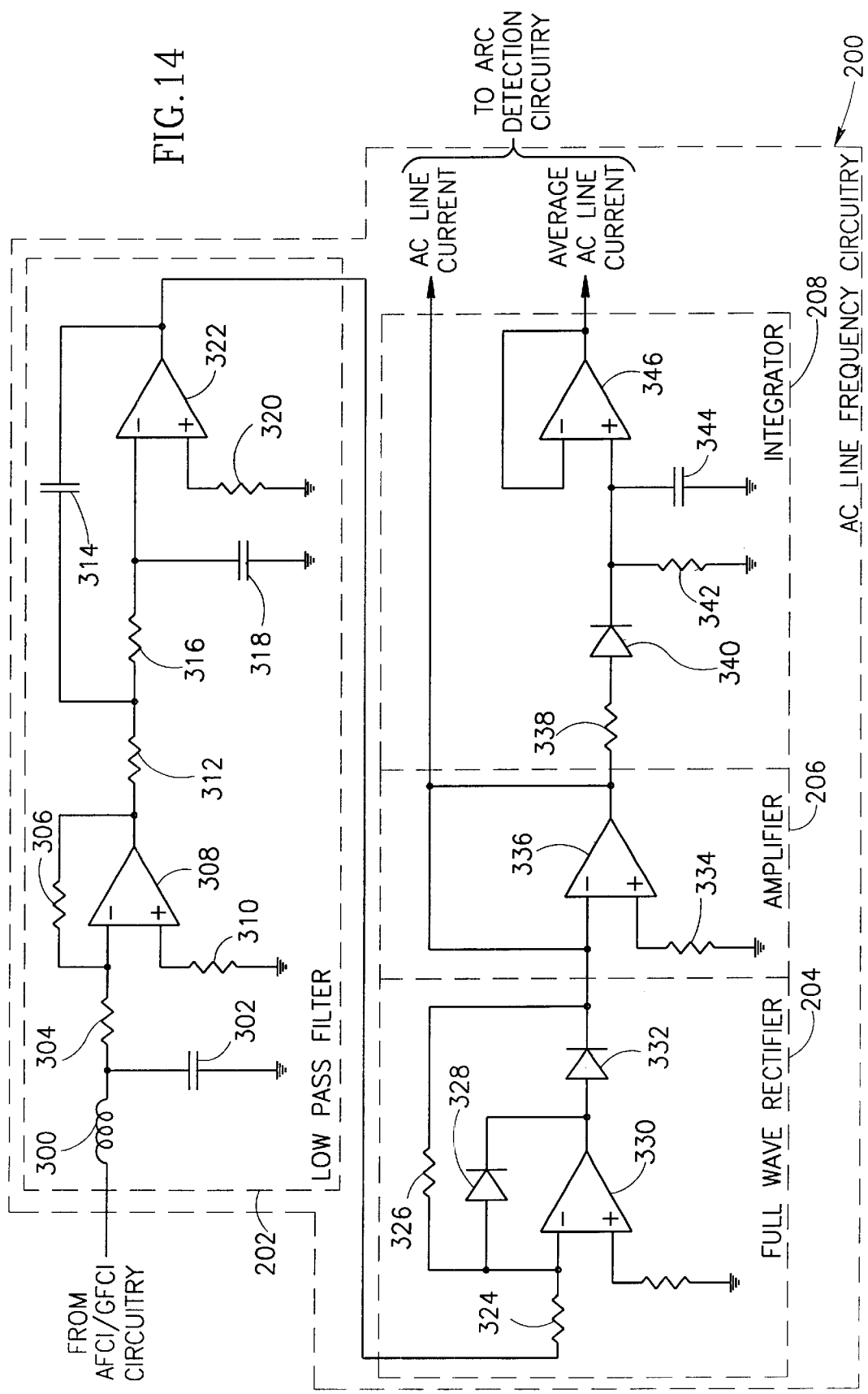

ARC FAULT DETECTOR WITH CIRCUIT INTERRUPTER AND EARLY ARC FAULT DETECTION

CROSS REFERENCE TO RELATED APPLICATIONS

This application is a continuation of application Ser. No. 08/993,745, filed Dec. 19, 1997, entitled Arc Fault Detector With Circuit Interrupter And Early Arc Fault Detection, now U.S. Pat. No. 6,128,169, issued Oct. 3, 2000, which is incorporated herein in its entirety by reference.

FIELD OF THE INVENTION

The present invention relates to an apparatus and method for early arc fault detection and more particularly relates to an apparatus and method for both a stand alone early arc fault detector and an early arc fault detector combined with a circuit interrupter device.

BACKGROUND OF THE INVENTION

Circuit breakers, fuses and ground fault circuit interrupters (GFCIs) are commonly used devices for protecting people and property from dangerous electrical faults. Fatalities and loss of property, however, still occur, being caused by electrical faults that go undetected by these protective devices. One such type of electrical fault that typically goes undetected are arc faults. Arcs are potentially dangerous due to the high temperatures contained within them. Thus, they have a high potential of creating damage, mostly through the initiation of fires. An arc, however, will only trip a GFCI it if produces sufficient current leakage to ground. In addition, an arc will trip a breaker only if the current, flowing through the arc, exceeds the trip parameters of the thermal/magnetic mechanism of the breaker. Therefore, an additional type of protection device is needed to detect and interrupt arcs that do not fit these criteria. An arc detector whose output is used to trigger a circuit interrupting mechanism is referred to as an arc fault circuit interrupter (AFCI).

According to the Consumer Product Safety Commission (CPSC) in 1992, it was estimated that "there were 41,000 fires involving home electrical wiring systems . . . which resulted in 320 deaths, 1600 injuries and $511 million in property losses." The CPSC further stated that "an electrically caused fire may occur if electrical energy is unintentionally converted to thermal energy and if the heat so generated is transferred to a combustible material at such a rate and for such a time as to cause the material to reach its ignition temperature." The two main causes of unintentional conversion of electrical energy to heat are excessive current and arcing. Circuit breakers and fuses are currently available to mitigate the results of excessive current, but no commercial system exists to mitigate arcing.

A dangerous condition may develop whenever prolonged arcing exists regardless of whether it involves industrial, commercial or residential power lines. However, mobile homes and especially homes with antiquated wiring systems are particularly vulnerable to fires started due to electrical causes. CPSC studies have shown that the frequency of wiring system fires is disproportionately high in homes over 40 years old.

The causes of arcing are numerous, for example: aged or worn insulation and wiring; mechanical and electrical stress caused by overuse, over currents or lightning strikes; loose connections; and excessive mechanical damage to insulation and wires. Two types of arcing occur in residential and commercial buildings: contact arcing and line arcing. Contact (or series) arcing occurs between two contacts in series with a load. Therefore, the load controls the current flowing in the arc. Line (or parallel) arcing occurs between lines or from a line to ground. Thus, the arc is in parallel with any load present and the source impedance provides the only limit to the current flowing in the arc. It is important for any arc detection system to be able to detect both contact and line arcing and to act appropriately depending upon the severity of the arc.

An example of contact arcing is illustrated in FIG. 1. The conductors 114, 116 comprising the cable 110, are separated and surrounded by an insulator 112. A portion of the conductor 114 is broken, creating a series gap 118 in conductor 114. Under certain conditions, arcing will occur across this gap, producing a large amount of localized heat. The heat generated by the arcing might be sufficient to break down and carbonize the insulation close to the arc 119. If the arc is allowed to continue, enough heat will be generated to start a fire.

A schematic diagram illustrating an example of line arcing is shown in FIG. 2. Cable 120 comprises electrical conductors 124, 126 covered by outer insulation 122 and separated by inner insulation 128. Deterioration or damage to the inner insulation at 121 may cause line fault arcing 123 to occur between the two conductors 124, 126. The inner insulation could have been carbonized by an earlier lightning strike to the wiring system, or it could have been cut by mechanical action such as a metal chair leg cutting into an extension cord.

The potentially devastating results of arcing are widely known and a number of methods of detecting arcs have been developed in the prior art. A large percentage of the prior art refers to detecting the high frequency signals generated on the AC line by arcs. FIG. 3 shows the wide spectrum noise 162 produced on the AC line by an arc. It is superimposed over the AC line voltage 164. An analysis of the arc waveform, using a frequency spectrum analyzer, shows that the overtones and high frequency harmonics contained within the waveform extend well into the GHz range. A graph illustrating the frequency spectrum analysis of the waveform 162 shown in FIG. 3 is shown in FIG. 4.

One major problem associated with any type of arc detection is false tripping. False tripping occurs when an arc detector produces a warning output, or disconnects a section of wiring from the voltage source, when a dangerous arcing condition does not actually exist. The two major causes of false tripping are normal appliance arcing and the inrush currents created by inductive and capacitive appliances. These two situations generate high frequency signals on the power line that are very similar to those generated by dangerous arcing. Thus, to be viable commercial devices, arc detectors must be able to distinguish arcing signals from the signals created by normal appliance use.

A wide range of prior art exists in the field of arc detection. Some of the prior art refers to specialized instances of arcing. For example, U.S. Pat. No. 4,376,243, issued to Renn, et al., teaches a device that operates with DC current. U.S. Pat. No. 4,658,322, issued to Rivera, teaches a device that detects arcing within an enclosed unit of electrical equipment. U.S. Pat. No. 4,878,144, issued to Nebon, teaches a device that detects the light produced by an arc between the contacts of a circuit breaker.

In addition, there are several patents that refer to detecting arcs on AC power lines that disclose various methods of detecting high frequency arcing signals. For example, U.S.

Pat. Nos. 5,185,684 and 5,206,596, both issued to Beihoff et al., employ a complex detection means that separately detects the electric field and the magnetic field produced around a wire. U.S. Pat. No. 5,590,012, issued to Dollar, teaches measuring the high frequency current in a shunted path around an inductor placed in the line, which can be the magnetic trip mechanism of a breaker. In a second detection circuit, proposed by Dollar, high frequency voltage signal is extracted from the line via a high pass filter placed in parallel with any load.

Various methods can be found in the prior art to authenticate arcing and to differentiate arcing from other sources of noise. Much of the prior art involves complicated signal processing and analysis. U.S. Pat. No. 5,280,404, issued to Ragsdale, teaches looking for series arcing by converting the arcing signals to pulses and counting the pulses.

In addition, several patents detect arcing by taking the first derivative or second derivative of the detected signal. For example, U.S. Pat. No. 5,224,006, issued to MacKenzie et al., and U.S. Pat. Nos. 5,185,684 and 5,206,596, issued to Beihoff et al, disclose such a device.

Blades uses several methods to detect arcs as disclosed in U.S. Pat. Nos. 5,223,795, 5,432,455 and 5,434,509. The Blades device is based on that fact that detected high frequency noise must include gaps at each zero crossing, i.e., half cycle, of the AC line. To differentiate arcing from other sources of noise, the Blades device measures the randomness and/or wide bandwidth characteristics of the detected high frequency signal. The device taught by U.S. Pat. No. 5,434,509 uses the fast rising edges of arc signals as a detection criterion and detects the short high frequency bursts associated with intermittent arcs.

U.S. Pat. No. 5,561,505, issued to Zuercher et al., discloses a method of detecting arcing by sensing cycle to cycle changes in the AC line current. Differences in samples taken at the same point in the AC cycle are then processed to determine whether arcing is occurring.

SUMMARY OF THE INVENTION

The arc detector of the present invention functions to monitor and sense the line voltage and current present on the AC power line for the occurrence of arcing. Both high frequency energy and AC line frequency energy are utilized in the detection of arc faults. The output of the detector can be used to activate a circuit interrupting mechanism, sound an audio alarm and/or alert a central monitoring station.

The present invention utilizes a single transformer as a grounded neutral fault detector and as an arc fault detector. This is accomplished by splitting one of the wires passing through the ground/neutral transformer of the GFCI into parallel paths such that a small portion of the current in the wire flows around the transformer. A differential current is then produced in the coil that is proportional to the current flowing through the AC line. The differential current is picked up by the ground/neutral transformer and is available for further processing. Thus, the ground/neutral transformer can be utilized as part of the arc detection circuitry. The differential current generated in the ground/neutral coil is relatively small, thus the ground fault and ground/neutral fault detection capabilities of the GFCI are unaffected. The use of the same coil for two purposes provides tight integration between the GFCI and the AFCI circuits.

The present invention also includes a novel early arc detection circuit capable of detecting high impedance on the AC line. Conventional line testers typically load the AC line in order to detect high impedance on the AC line at a particular moment in time. The present invention uses a hardwired test circuit, which periodically tests the AC line with a controlled load. The circuit ensures that the line is loaded for only a short period when the AC line voltage is low, thus keeping power dissipation in the device low. Using this method, points of high impedance on the line, which may lead to arcing and dangerous heating, can be detected before dangerous arcing occurs.

The early arc detection circuit functions to generate pulses proportional to the line impedance to determine the impedance of the AC line. An inductor/capacitor network is utilized to generate pulses proportional in size to the drop in line voltage caused by the introduction of a controlled load. The drop in voltage is itself proportional to the line impedance between the AFCI/GFCI and the AC voltage source.

The arc detector of the present invention can be implemented as a standalone device or can be implemented in combination with an existing circuit interrupting device. The term 'circuit interrupting device' is defined to mean any electrical device used to interrupt current flow to a load and includes, but is not limited to devices such as Ground Fault Circuit Interrupters (GFCIs), Immersion Detection Circuit Interrupters (IDCIs) or Appliance Leakage Circuit Interrupters (ALCIs).

A main feature of the arc detector of the present invention is that it combines an arc detector, i.e., arc fault circuit interrupter (AFCI) with other types of circuit interrupting devices such as a GFCI to create an AFCI/GFCI multipurpose device. In the case of a GFCI, the arc detection circuitry can be placed onboard the same silicon chip typically used in today's GFCI devices. Indeed, some of the pins of commonly used GFCI integrated circuits can be converted for multifunction operation. The AFCI can be powered from the same power supply that provides power to the circuit interrupting device. This combined approach results in reduced manufacturing costs. The mechanical parts of the circuit interrupting device such as the trip relay and the mechanical contact closure mechanisms now serve dual purposes. In addition, adding AFCI circuitry to an existing circuit interrupting device is a logical enhancement of such present day devices. In particular, it is logical to enhance a GFCI with AFCI circuitry since a GFCI can detect arcing in certain situations including any condition whereby an arc produces leakage current to ground.

In the AFCI/GFCI device of the present invention, the current waveform present on the AC line is extracted via a toroidal current to voltage transformer that is shared with the circuit interrupting device. An impedance splits the current flow into two portions so as to generate differential current proportional to the current flowing through the line conductors. The voltage that is generated across the windings of the transformer is fed to two separate paths.

In the first path, the 50 or 60 Hz AC line frequency content of the transformer output is filtered from the input signal. This AC line frequency signal provides an indication of the amount of current flowing through the AC power line. In the second path, the high frequency content of the transformer output is filtered from the input signal. The high frequency signal is indicative of the level of arcing present on the AC power line.

Within each of the two paths, the signals are filtered by a second stage filter and then rectified. The two rectified signals are each split to produce peak and average levels for the AC line frequency and high frequency signals. Excessively high peaks in either the AC line frequency or high frequency path instantly causes the relay mechanism of the AFCI/GFCI to trip, disconnecting the load from the power source.

The absolute average levels of the AC line frequency and high frequency signals are converted to a DC potential and compared to a set of predefined voltages. If the average high frequency signal is greater than the level expected from normal appliance arcing at the associated average AC line frequency level, then an output signal is generated. This output signal is then used to trip the device or produce an alarm both being controlled via a timer mechanism. A user can disable the AFCI function temporarily or permanently so that devices with normally high levels of arcing, such as arc welders, can be operated without tripping the arc detector.

The detection of high average AC line frequency or high frequency signals causes the device to immediately trip. This immediate tripping cannot be disabled via the timer mechanism described above. In addition, the ground fault protection mechanism and excessive arc current and AC line current detection cannot be disabled. This is so a user is continually protected from the potential dangers associated with these conditions.

An advantage of the present invention is that separating the detection of the AC line current and the high frequency energy generated by the arc provides increased immunity to noise. The arc detection device detects the current flowing in the AC line across a wide range of frequencies. By splitting the two current signal components and setting a maximum permitted level of high frequency component for a given level of AC line current, the arc detector provides increased immunity to noise.

In addition, the arc detector of the present invention simultaneously performs average and peak detection of AC line current and high frequency arcing signal. The peak AC line current and high frequency arcing signals are detected to provide an immediate response to large increases in either arcing or AC line current. The arc detector will trip the relay the instant either the peak AC line current signal or the peak high frequency arcing signal crosses a predetermined threshold.

The arc detector also incorporates a fast trip circuit which functions to open the relay when excessive average AC line current and high frequency arcing levels are detected. If either the average AC line current or the average high frequency arcing signal rises above a level considered to be dangerous, the device will trip very quickly. The maximum level permitted for the average AC line current is approximately 1.5 times the rated AC line current. The limit set for the average high frequency signal is a level of average arcing that is known to be dangerous.

When the levels of average AC line current and high frequency signal are lower than their respective maximums, the arc detector utilizes various trip levels for arcing, dependent upon the level of the average AC current flowing. Furthermore, the arc detector trips at a slower speed at these lower and thus less dangerous arcing levels. This slower trip response time provides noise immunity against short lived noise and arcs, such as arcs generated when toggling a switch. By incorporating various trip times, dependent on the level of arcing detected, the arc detector can extinguish dangerous arcs quickly while providing high noise immunity for lower level arcs.

The arc detector also incorporates an automatic bypass timer to permit otherwise normally safe arcing. Rather than include an on/off fixed switch, which would function to completely enable or disable the arc detector, the present invention incorporates a logical switch. This logic switch provides a user with the option of disabling the arc detector for as long as the switch is off or disabling the arc detector temporarily while arcing appliances are in use. This permits the use of appliances that normally generate high amounts of arcing that would otherwise cause the arc detector to trip. When the arc detector is temporarily disabled, it automatically returns to the enabled state after the appliance has been disconnected. This scheme has the advantage that the device cannot accidentally be permanently disabled by the user. An important feature of this scheme is that the arcing appliance can be turned on and off within the given time period without tripping the arc detector.

Further, the arc detector includes circuitry to transmit messages on the AC power line using any power line carrier system pinpointing the location of arc fault. The present invention incorporates a communications circuit, which utilizes a power line carrier signal such as generated by the CCS product line manufactured by Leviton Manufacturing, Little Neck, N.Y. Using well known power line carrier techniques the arc detector can communicate with other devices such as a monitoring station. Each arc detector would have a unique address. A relationship is then established between the address assigned to the arc detector and its location. When an arc fault is detected, a signal is sent over the power lines to a monitoring station which alerts personnel of not only the occurrence of the arc fault but also its location. This is helpful especially if the AFCI/GFCI device is installed in a remote location. This feature has applicability in industrial and commercial locations where central arc fault supervision over a complex AC electrical wiring system is needed.

Today, AC power lines are not only used for supplying AC line current but they are also used as a media for communications as in Leviton Manufacturing's CCS line of power line carrier devices, CEBus compatible devices, LonWorks compatible devices, power line carrier based intercoms, TV signal transmission/reception equipment, telephone communication devices, etc. The arc detector of the present invention incorporates a filter circuit which permits the detection of arc faults while communications over the AC power lines is occurring. The filter circuit functions to remove frequencies below 500 KHz. On the other end of the frequency spectrum, although arcing generates frequencies into the GHz range, for simplicity, efficiency and reduced cost the arc detector of the present invention limits detection of high frequency signals to approximately 20 MHz.

BRIEF DESCRIPTION OF THE DRAWINGS

The invention is herein described, by way of example only, with reference to the accompanying drawings, wherein:

FIG. 12A is a graph illustrating the voltage present at node Z superimposed over the voltage $V_{RECT}$ over a full cycle of the AC cycle;

FIG. 12B is a graph illustrating the voltage present at node Z superimposed over the voltage $V_{RECT}$ during the firing of the SCR for an AC line having relatively low impedance;

FIG. 12C is a graph illustrating the voltage present at node Z superimposed over the voltage $V_{RECT}$ during the firing of the SCR for an AC line having relatively high impedance;

FIG. 14 is a schematic diagram illustrating the AC line frequency circuitry portion of the arc fault detection device of the present invention in more detail;

DETAILED DESCRIPTION OF THE INVENTION

Ground Fault Circuit Interrupters (GFCIs) are well known electrical devices in common use today. They are used to help protect against electrical shock due to ground faults. A GFCI is basically a differential current detector operative to trip a contact mechanism when 5 mA or more of unbalanced current is detected between the phase (hot or Ø) wire and the neutral (N) wire of an AC electrical power line. The unbalanced current detected is assumed to be flowing through a human accidentally touching the phase wire. The current flows through the human to ground rather than returning through the differential transformer via the neutral wire, thus creating the current imbalance described above. It should be noted that, not only current through a human, but also an appliance with inherent leakage to ground of 5 mA or more, would also trip the GFCI and disconnect the current to the load.

Figure 1:
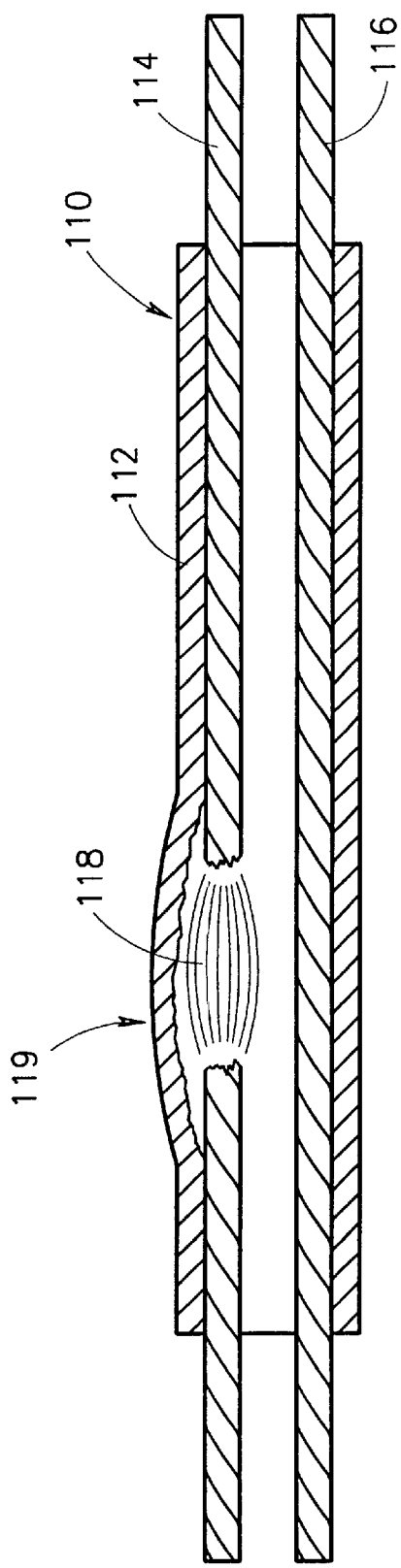
FIG. 1 is a schematic diagram illustrating an example of contact arcing in a current carrying conductor.
Figure 2:
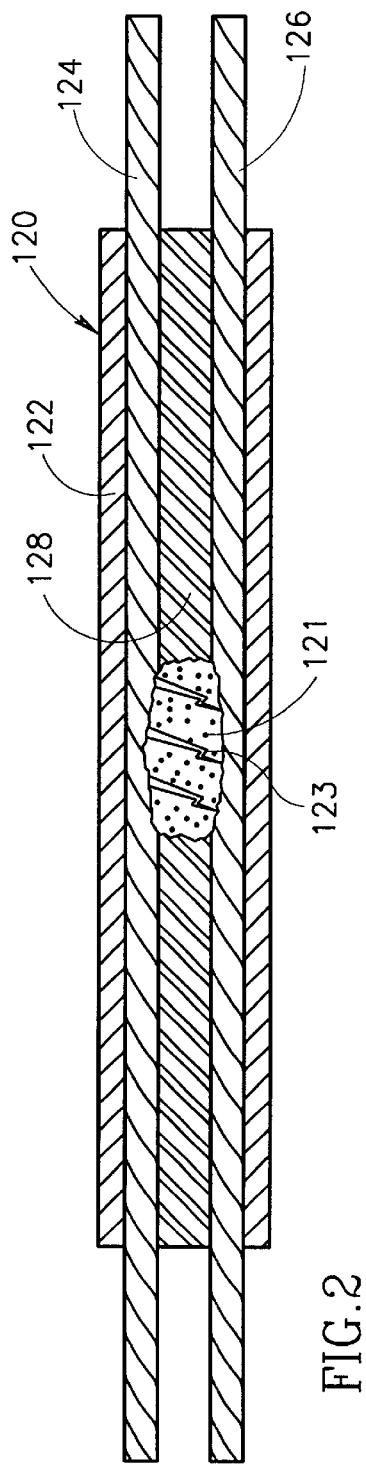
FIG. 2 is a schematic diagram illustrating an example of line arcing between two current carrying conductors.
Figure 3:
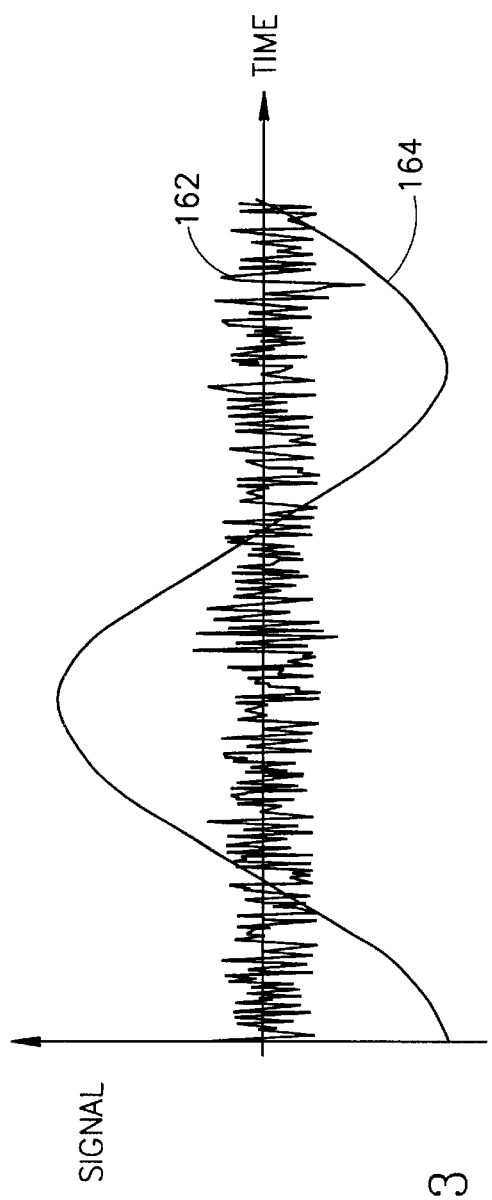
FIG. 3 is a graph illustrating the broad spectrum noise due to the EMF voltage generated by an arc propagating over the power line which is shown superimposed over the AC line voltage.
Figure 4:
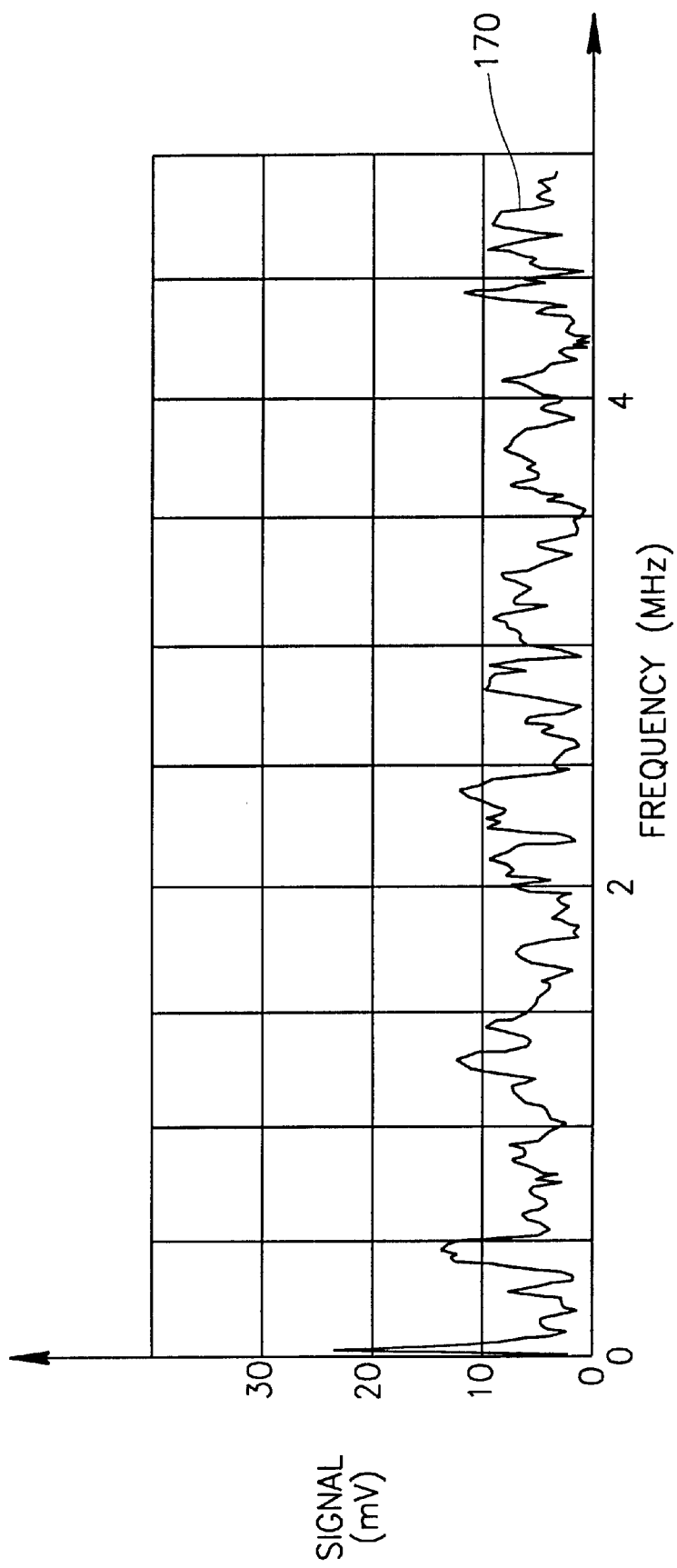
FIG. 4 is a graph illustrating frequency spectrum analysis of the waveform shown in FIG. 3.
Figure 5:
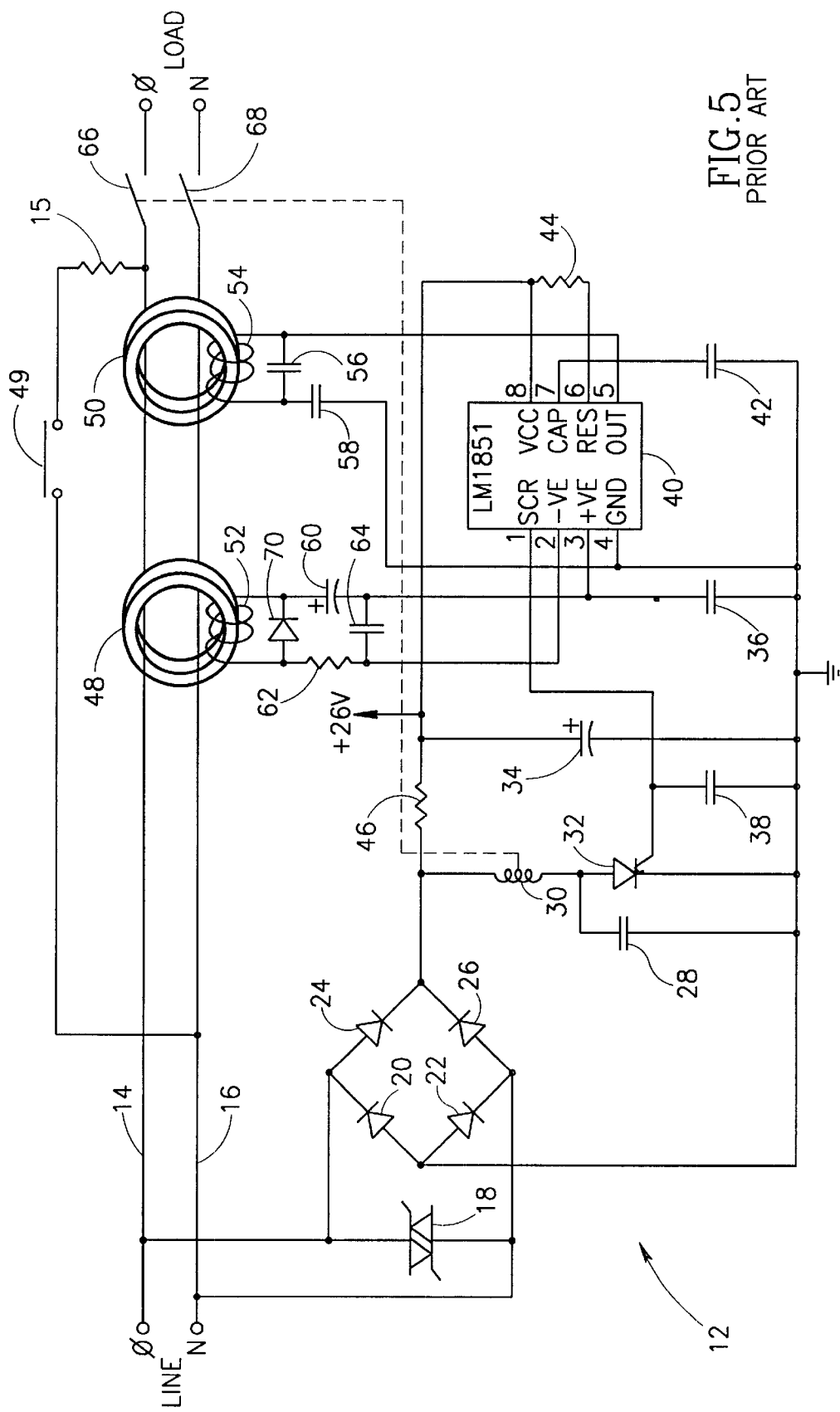
FIG. 5 is a schematic diagram illustrating an example of a prior art ground fault circuit interrupter device.

A schematic diagram illustrating an example of a prior art ground fault circuit interrupter device is shown in FIG. 5. The typical prior art GFCI, generally referenced 12, comprises two current transformers consisting of magnetic cores 48, 50 and coils 52, 54, respectively, coupled to integrated circuit 40 which may comprise the LM1851 manufactured by National Semiconductor. The AC power from the phase 14 and neutral 16 conductors is full wave rectified via a full wave rectifier comprising diodes 20, 22, 24, 26. A metal oxide varistor (MOV) 18 is placed across phase and neutral for protection. The output of the bridge is coupled across a relay coil 30 in series with the parallel combination of a silicon controlled rectifier (SCR) 32 and a capacitor 28. The gate of the SCR is coupled to ground via capacitor 38 and to pin 1 of IC 40.

A diode 70 is placed across the coil 52 which is coupled to pins 2 and 3 via resistor 62 and capacitors 64, 60. Pin 3 is also coupled to ground via capacitor 36. Coil 54 is coupled to pins 4 and 5 of IC 40 via capacitors 58, 56. Pin 4 is also coupled to ground. Pin 6 of IC 40 is coupled to pin 8 via resistor 44 and pin 7 is coupled to ground via capacitor 42. Pin 8 is also coupled to capacitor 34 and to resistor 46. The voltage on pin 8 serves as the 26V supply voltage for the GFCI circuitry.

Line side electrical conductors, phase 14 and neutral 16, pass through the transformers to the load side phase and neutral conductors. A relay, consisting of switches 66, 68, associated with the phase and neutral conductors, respectively, function to open the circuit in the event a ground fault is detected. The switches 66, 68 are part of a double throw relay which includes coil 30. The coil 30 in the relay is energized when the GFCI circuitry turns on the silicon controlled rectifier (SCR) 32. In addition, the GFCI 12 comprises a test circuit comprised of momentary push button switch 49 connected in series with a resistor 15. When the switch 49 is pressed, a temporary simulated ground fault, i.e., a temporary differential current path, from phase to neutral is created in order to test the operation of the GFCI 12.

Figure 6:
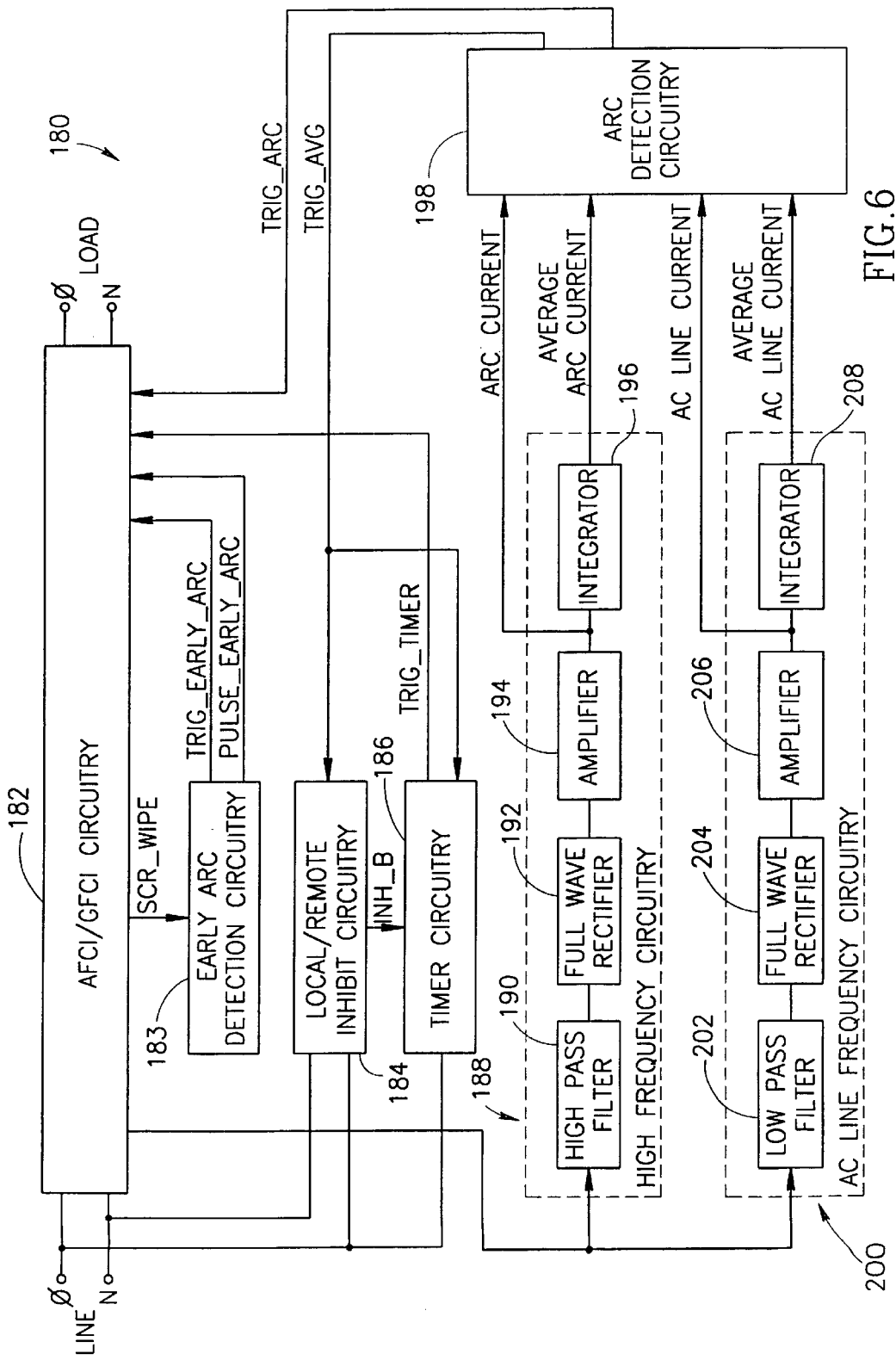
FIG. 6 is a high level block diagram illustrating the combination arc fault detector and ground fault circuit interrupter device of the present invention.

A high level block diagram illustrating the arc fault/circuit interrupter device of the present invention is shown in FIG. 6. For illustrative purposes only, the description that follows is within the context of a combination arc fault circuit interrupter/ground fault circuit interrupter (AFCI/GFCI) device. It will be appreciated by those skilled in the electrical arts that other types of circuit interrupting devices such as IDCIs or ALCIs can also be combined with the arc fault detector.

The AFCI/GFCI device, generally referenced 180 and hereinafter referred to as the device, comprises AFCI/GFCI circuitry 182, early arc detection circuitry 183, AC line frequency circuitry 200, high frequency circuitry 188, arc detection circuitry 198, local/remote inhibit circuitry 184 and timer circuitry 186. The AFCI/GFCI circuitry 182 generally comprises a standard GFCI device in addition to several components that are shared between the AFCI and the GFCI portions of the device. The device is a four terminal device comprising line side phase and neutral leads as well as load side phase and neutral leads. Normally, the device is coupled to an electrical wiring system or network with the line side phase and neutral terminal electrically connected to a source of AC power. The load side phase and neutral terminals are connected to electrical devices located downstream from the device.

Figure 7:
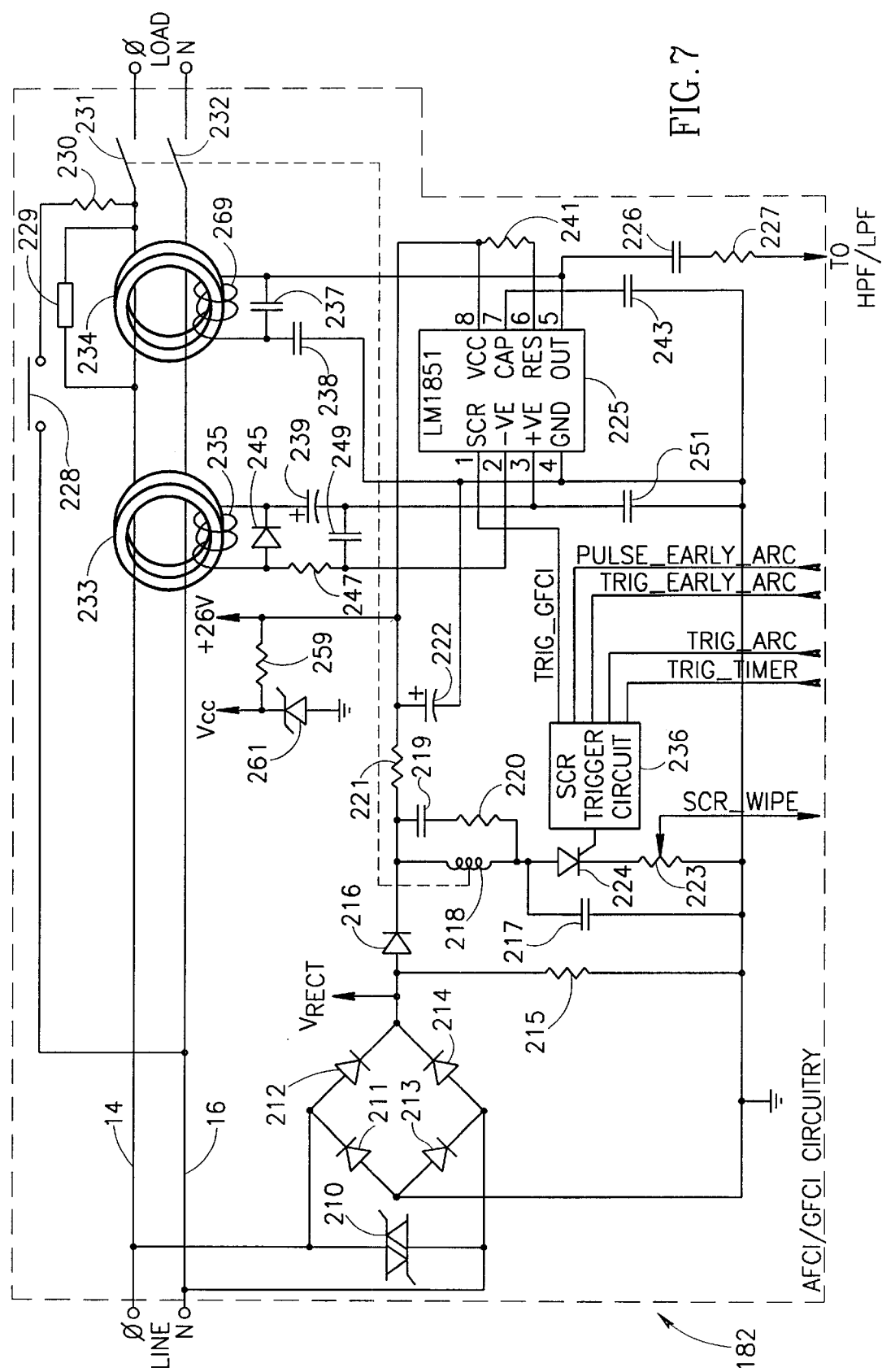
FIG. 7 is a schematic diagram illustrating the AFCI/GFCI circuitry portion of the arc fault detection device of the present invention more detail.

Each of the components of the device 180 is described in more detail hereinbelow, beginning with the AFCI/GFCI circuitry. A schematic diagram illustrating the GFCI/AFCI circuitry portion of the arc fault detection device of the present invention in more detail is shown in FIG. 7.

A GFCI is an electrical device that functions to detect hazardous grounding conditions in consumer and industrial environments. An unbalanced current through the differential transformer 233 is sensed by the circuitry. If the current imbalance is above a specified threshold, which has been determined to be dangerous to personnel or machinery, the integrated circuit (IC) 225 triggers SCR 224. The SCR 224, in turn, activates the coil 218 of a relay circuit breaker comprising phase contacts 231 and neutral contacts 232 thus disconnecting the source of electrical power from the load. When the GFCI circuitry detects the existence of a ground fault, the signal line TRIG_GFCI is made active. In this way the circuit protects users from harmful or lethal electric shocks. The SCR trigger circuit 236 has five trigger inputs, TRIG_GFCI, TRIG_TIMER, TRIG_EARLY_ARC, PULSE_EARLY_ARC and TRIG_ARC. Normally the five trigger signals are in an inactive state. However, any or all of the five trigger inputs going active will cause the SCR trigger circuit to turn the SCR 224 on.

A second differential transformer 234 within the AFCI/GFCI circuitry is provided to detect a low impedance condition between the load side neutral wire and ground. A low impedance neutral/ground connection allows ground fault current to leak back from the ground to the neutral wire passing through the differential transformers. This reduces the sensitivity of the GFCI and potentially permits lethal ground faults to occur without the GFCI tripping. If the impedance of the neutral/ground connection becomes too low, the IC 225 triggers the SCR 224 via the TRIG_GFCI signal, thus disconnecting both phase and neutral from the load.

As described previously, the ground/neutral transformer 234 is utilized to detect ground to neutral faults and is specifically designed for that purpose. In the present invention this transformer is utilized to perform two functions simultaneously. For detecting ground faults, this transformer is used in a differential mode. The sum of the currents, in the two wires passing through its center, is zero in the absence of a ground fault or ground/neutral fault. However, by creating a bypass, via impedance 229 placed in parallel with one of the AC wires (the phase line was chosen for this example), the net output of the transformer secondary is made proportional to the current flowing in the AC line. The signal on the secondary, which is an accurate representation of the current in the AC line across a wide range of frequencies, is fed via capacitor 226 and resistor 227 to the input of the low pass and AC line frequency filters.

The parallel impedance 229 is effective to bypass only a very small amount of the total current, which normally flows through the AC lines. The normal operation of the GFCI circuit is unaffected since differential current is generated only in the ground/neutral transformer 234 and not in the differential transformer 233. If the impedance 229 is purely resistive, e.g., a resistor or a thin wire of less than 1 ohm, the frequency response of the ground/neutral transformer 234 is unaffected. In contrast, a capacitive impedance will substantially affect the frequency response of the transformer. Therefore, by choosing different reactance values for the bypass impedance, the frequency dependence of the detection can be optimized as desired.

In particular, the AFCI/GFCI circuit, generally referenced 182, comprises two current transformers consisting of magnetic cores 233, 234 and coils 235, 269, respectively, coupled to integrated circuit 225 which may comprise the LM1851 manufactured by National Semiconductor or the RA9031 manufactured by Raytheon. The AC power from the phase 14 and neutral 16 conductors is full wave rectified via a full wave rectifier comprising diodes 211, 212, 213, 214. A metal oxide varistor (MOV) 210 is placed across phase and neutral for over voltage protection. The voltage output of the bridge, represented as $V_{RECT}$ is loaded by resistor 215 to ensure that the voltage at $V_{RECT}$ falls to a low voltage at the zero crossing of the AC line. Diode 216 allows current to flow from $V_{RECT}$ to power the AFCI/GFCI circuitry while ensuring that the DC elements of the power supply to not effect the voltage at $V_{RECT}$. The cathode of the diode 216 is coupled to the relay coil 218 and the voltage dropping resistor 221 as in the prior art GFCI of FIG. 5. In addition, the series combination of resistor 220 and capacitor 219 are connected in parallel with the relay coil 218. SCR 224 and variable resistor 223 are coupled in series with the relay coil. Capacitor 217 boosts the power available to the device while the SCR is open circuit. The gate of the SCR is coupled to the output of an SCR trigger circuit 236. The output of pin 1 of IC 225 forms one of the inputs to the SCR trigger circuit 236.

A diode 245 is placed across the coil 235 which is coupled to pins 2 and 3 via resistor 247 and capacitors 239, 249. Pin 3 is also coupled to ground via capacitor 251. Coil 269 is coupled to pins 4 and 5 of IC 225 via capacitors 237, 238. Pin 4 is also coupled to ground. Pin 6 of IC 225 is coupled to pin 8 via sensitivity resistor 241 and pin 7 is coupled to ground via timing capacitor 243. Pin 8 is also coupled to capacitor 222 and to resistor 221. The voltage on pin 8 serves as the 26 V supply voltage for the GFCI circuitry. The 26 V is coupled to a resistor 259 and a zener diode 261 which functions to generate a lower $V_{CC}$ supply voltage for use by internal circuitry of the AFCI/GFCI.

Line side electrical conductors, phase 14 and neutral 16, pass through the transformers to the load side phase and neutral conductors. A relay, consisting of switches 231, 232, associated with the phase and neutral conductors, respectively, function to open the circuit in the event a ground fault is detected. The switches 231, 232 are part of a double throw relay which includes coil 218. The coil 218 in the relay is energized when the AFCI/GFCI circuitry turns on the SCR 224. In addition, the circuit comprises a test button comprised of momentary push button switch 228 connected in series with a resistor 230. When the switch 228 is pressed, a temporary simulated ground fault from phase to neutral is created in order to test the operation of the device.

Standard GFCI circuits are in widespread use today and numerous patents have been issued describing various methods of GFCI operation. Detailed descriptions of typical GFCI circuits can be found, for example, in U.S. Pat. No. 5,202,662, issued to Bienwald et al.

It is believed that one novel feature of the present invention is the incorporation into a GFCI device of circuitry necessary for detecting arc faults. The remainder of this document describes the arc detection (AFCI) circuitry in more detail.

Note that both AFCI and GFCI circuits operate to interrupt the AC power by opening two sets of contacts 231, 232 via the actuation of a relay coil 218. The relay coil is actuated by triggering the SCR 224 via the SCR trigger circuit 236. Although either the AFCI or GFCI circuits can trigger the SCR 224, their triggering signals are isolated from one another. The SCR trigger circuit functions to provide an OR type logic operation to trigger the SCR 224 using well known thyristor triggering techniques when either of its five input triggers TRIG_GFCI, TRIG_TIMER, TRIG_EARLY_ARC, PULSE_EARLY_ARC or TRIG_ARC go active.

Figure 8:
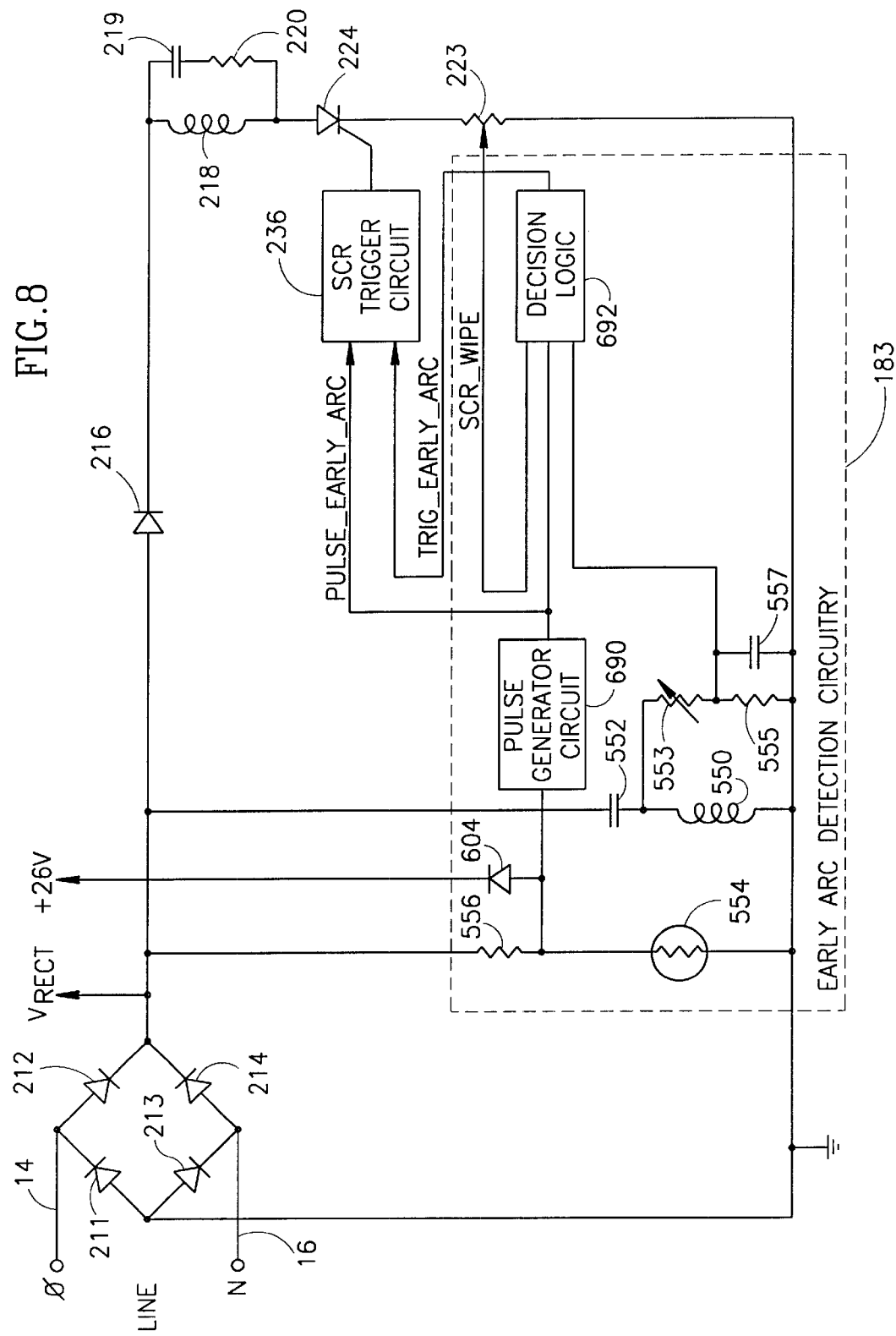
FIG. 8 is a high level block diagram illustrating the early arc detection circuitry portion of the present invention in more detail.

The early arc detection circuitry of the present invention will now be described in more detail. A schematic diagram illustrating the early arc detection circuitry portion in more detail is shown in FIG. 8. To be able to evaluate the quality of the electrical connections leading to the main 'feed,' the AC line is subjected to a load condition. For example, if the wire leading to the circuit breaker is 'loosely' connected, the normal impedance of the AC line, which is in the order of 0.01 to 0.05 ohms, can potentially increase one hundred fold. This situation is not easily detectable by a user, if appliances with low current consumption are used. However, when a heavy load, such as an air conditioner which draws 15 to 20 A is connected to a 'weak' or high impedance power line the weak or loose junction will dissipate heavily. Recall that dissipated power is given by the following expression.

$$P=I^2R$$

where P represents power, I represents current and R represents resistance. Thus, with a 20 A load and an assumed 'loose' junction resistance of 2 ohms, the power P dissipated by the junction will be 800 W. This situation will lead to dangerous spot heating of the loose junction which can not only lead to arcing but creates a great possibility of fire.

To alleviate this problem, the early arc detection circuit 183 functions to periodically test the line for integrity, i.e., the source impedance is measured. In the example circuit presented herein, the test is performed every half cycle of the AC or every 8.3 milliseconds. The circuit utilizes the SCR which is present in the GFCI circuit and functions to disconnect the load from the AC source when a ground fault is detected. Poor line integrity is detected by generating a pulse that is directly proportional to the source impedance of the power line. This ability is very useful when testing the quality of the branch circuit to which the AFCI/GFCI device is connected.

With reference to FIG. 8, to aid in understanding the principles of the present invention, the early arc detection circuit 183 is shown together with a portion of the GFCI circuitry shown in FIG. 7. The remaining circuitry from FIG. 7 has been intentionally left out for clarity sake. The early arc detection circuit 183 comprises a pulse generator circuit 690 coupled to a voltage divider made up of resistor 556 and thermistor 554. The output of the voltage divider is also connected to the 26 V supply via diode 604. The voltage divider is coupled across $V_{RECT}$ and ground. The voltage $V_{RECT}$ is also coupled to a capacitor 552 and inductor 550 in series. A voltage divider comprising variable resistor 553 and fixed resistor 555 is coupled across the inductor 550. A capacitor 557 is connected in parallel across resistor 555. The output of the pulse generator circuit 690 PULSE_EARLY_ARC forms one of the five inputs to the SCR trigger circuit 236. The output of the pulse generator is also input to decision logic 692. The other two inputs comprise the wipe terminal on variable resistor 233 coupled to the cathode of SCR 224 and the voltage across the resistor 555.

In general, operation of the early arc detection circuit is as follows. At the descending portion of the rectified AC line, a short duration timing pulse is generated which fires the SCR 224. The pulse generator 690 is deactivated throughout the rest of the half cycle in order to prevent unwanted triggering of the SCR. The timing of the pulse is calculated such so as to not activate the relay coil 218 sufficiently to open the contacts. The triggering of the SCR is initiated when the voltage on the AC line reaches approximately 15 V. At this time, the line is loaded with the coil 218 and a resistor 220/capacitor 219 network in parallel with the coil 218. The generation of the pulse and the subsequent triggering of the SCR to apply the loading activates the decision logic 692 which functions to make a logical decision concerning the quality of the AC line.

If the impedance of the AC line is normal, i.e., low, due to no loose connections, then a pulse is generated across the wipe of variable resistor 233. In addition, no pulse is generated across the capacitor 557. In this case, the decision logic keeps the output signal TRIG_EARLY_ARC de-active, i.e., low. However, if the impedance of the AC line is not normal, i.e., high, due to loose connections, then a pulse fails to be generated across the wipe of variable resistor 233 and a pulse appears across the capacitor 557. In this case, the decision logic causes the output signal TRIG_EARLY_ARC to go active, i.e., high.

With reference to FIG. 7, resistor 215 and diode 216 function to ensure that the rectified AC reference voltage used by the circuit $V_{RECT}$ falls to zero potential at the AC zero crossing. The variable resistor 223 is added in series with the SCR 224 to form part of the line impedance detection circuitry, shown in more detail in FIG. 9 hereinbelow. In addition, resistor 220 and capacitor 219 in series with each other are added in parallel to the relay coil 218 in order to reduce the impedance of the coil to a value that will load the AC line sufficiently to detect high line impedance. The SCR trigger circuit 236 which provides the gate signal for the SCR 224, functions to isolate the various trigger signals from each other.

Figure 9:
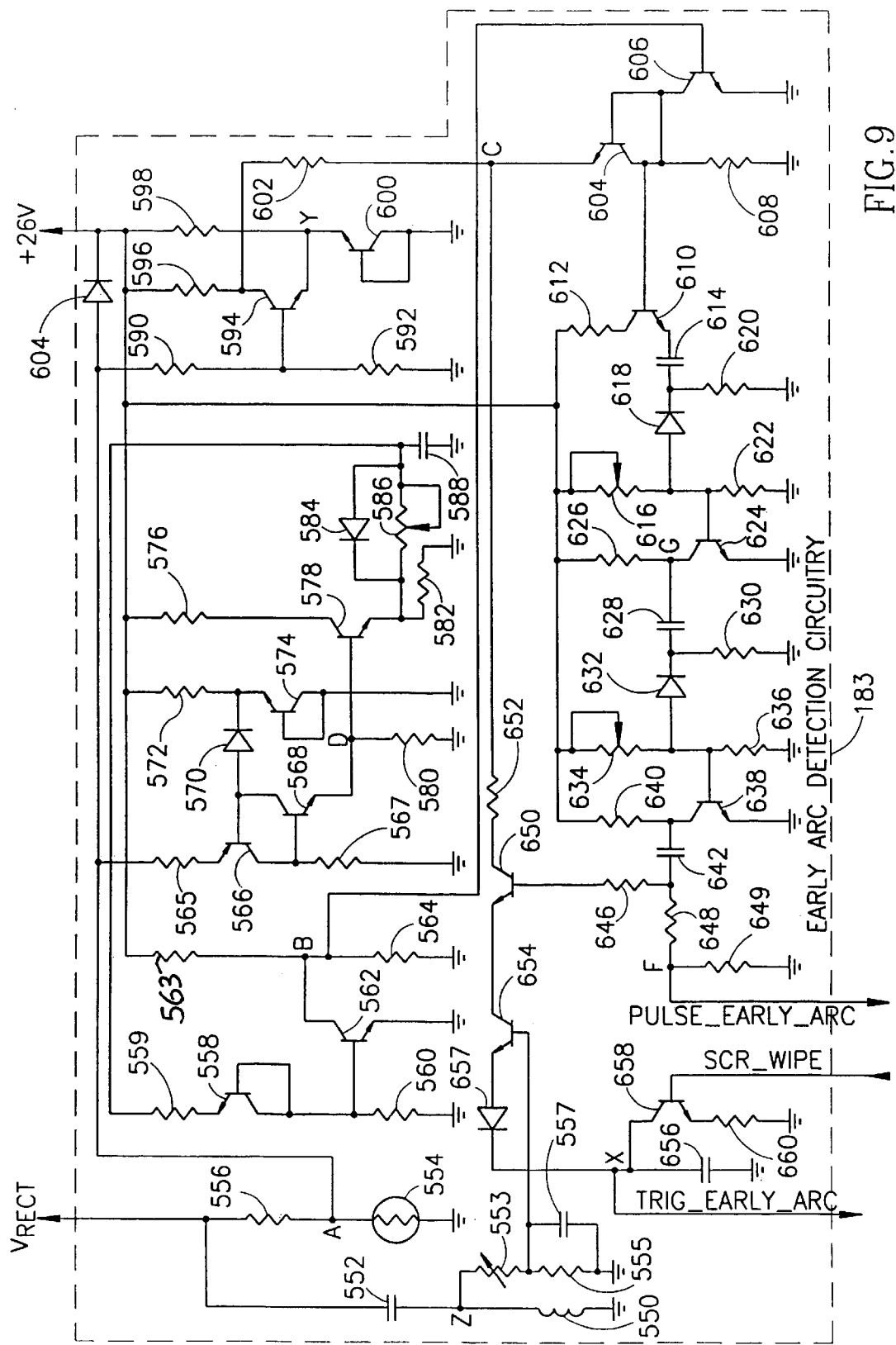
FIG. 9 is a schematic diagram illustrating the early arc detection circuitry in further detail.

A schematic diagram illustrating the early arc detection circuitry in further detail is shown in FIG. 9. Two voltage sources are used to supply the circuit. The first voltage source is the rectified AC line voltage $V_{RECT}$ and the second voltage source used in the circuit is the filtered and regulated 26 VDC power supply voltage.

Figure 10:
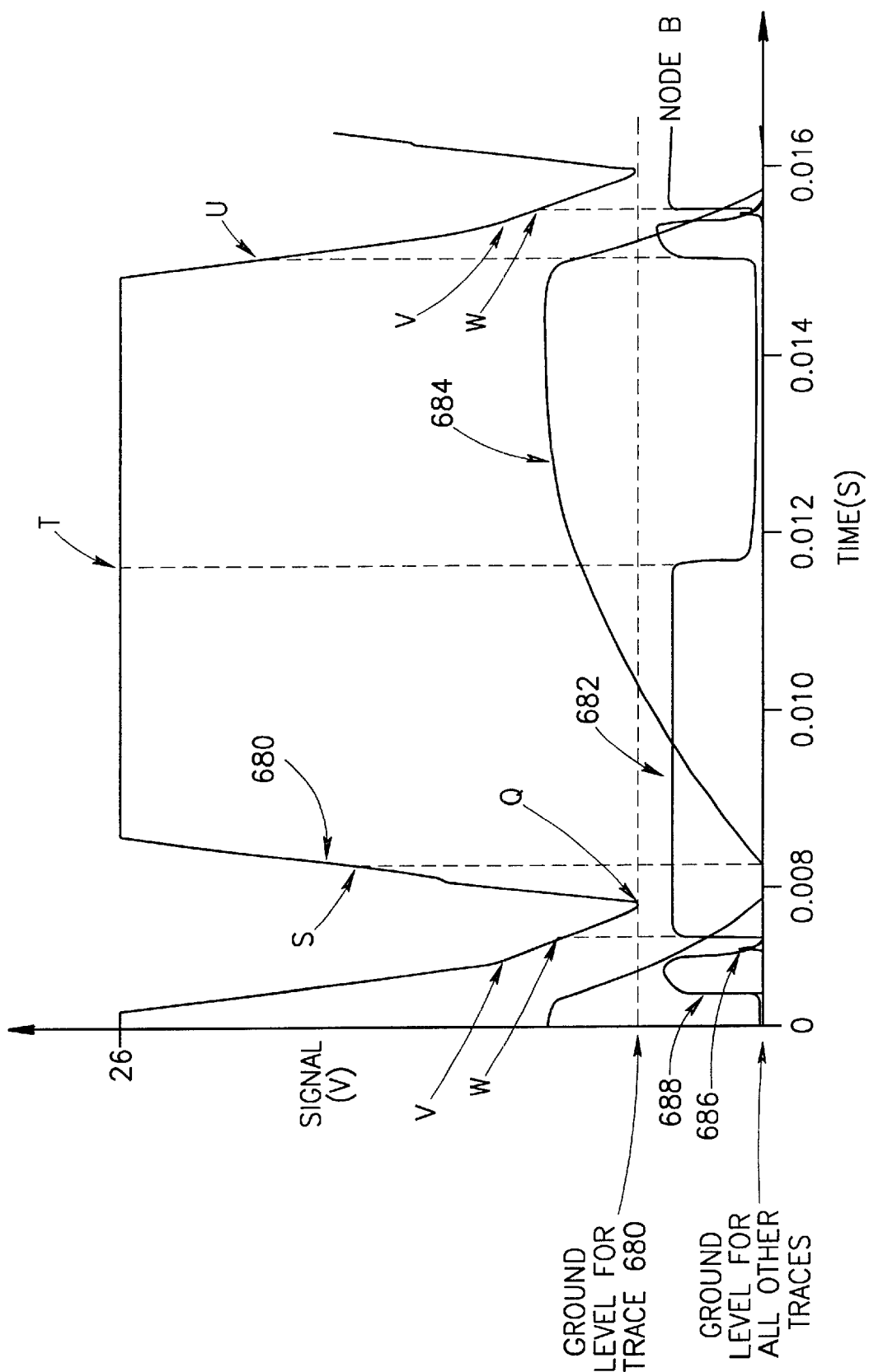
FIG. 10 is a graph illustrating several waveform traces within the early arc detection circuitry.

The rectified AC voltage $V_{RECT}$ is coupled to resistor 556 which is in series with thermistor 554 coupled to ground. The ratio of the resistor 556 to the thermistor 554 is approximately 2:1. Thus, the voltage at node A is ⅓ of $V_{RECT}$. Node A is also connected to the regulated 26 V via diode 604. Therefore, the maximum voltage possible at node A is 26 V. This is the highest voltage that the electronic components in the early arc detection circuit will be exposed to. This permits a designer to combine most of the circuit into a AFCI/GFCI integrated circuit. A graph illustrating the waveform trace present at node A and other nodes in the circuit is shown in FIG. 10. Waveform trace labeled 680 represents the voltage at node A. Note that to avoid confusion the horizontal dashed line representing the ground level for trace 680 only was raised above the x-axis. The lower solid line (x-axis) represents ground level for all other traces.

With reference to FIGS. 9 and 10, the thermistor 554 performs a regulating function on the full wave rectified voltage $V_{RECT}$. Regulation is needed in order to obtain the timing necessary for the proper operation of the circuit. As the AC line voltage rises above its nominal value, i.e., 120 VRMS, the current through the thermistor 554 increases. This causes the temperature of thermistor 554 to rise causing its resistance to decrease, thus lowering the voltage at node A. When the AC line voltage falls below its nominal voltage, the current through the thermistor 554 decreases and the thermistor cools off. The drop in temperature causes the resistance of the thermistor to increase, thus increasing the voltage at node A. In this fashion, a stabilized reference voltage is created at node A.

To aid in understanding the operation of the circuit of FIG. 9, the operation of the circuit during one half cycle of the AC line will be described. The description begins at the point in the AC cycle where the voltage at node A is at zero potential as the AC line passes through a zero crossing. This is represented in FIG. 10 at point Q. At this time, the base of transistor 594 is at zero potential. The emitter of 594 is biased to approximately 5 V by resistor 598 and transistor 600 which operates as a zener diode. Thus, transistor 594 is off. The voltage at node Y is approximately 5 V due to the voltage divider made up of resistor 598 and zener 600. Since transistor 594 is off, the voltage on the collector is not pulled down to the 5 V present at node Y. Rather the voltage on the collector rises towards 26 V. This generates a sufficient voltage at node C to break over transistor 604 which functions as a zener diode. Current thus flows through resistors 596, 602 and zener 604, generating sufficient voltage across resistor 608 to turn transistor 610 on.

However, at this time in the half cycle, transistor 606 is saturated due to the bias voltage divider made up of resistors 563, 564. This keeps the base of transistor 610 at virtual ground, preventing it from turning on. Transistor 610 remaining off prevents the pulse generating circuit comprising transistors 624, 638 from operating. The operation of the pulse generating circuit is described hereinbelow.

The voltage at node A thus rises from zero potential until it reaches approximately 6 V. At this time, the voltage on the base of transistor 594 reaches a high enough level to turn the transistor on. Note that the voltage on the base of transistor 594 closely follows the voltage at node A, since the ratio of resistors 590, 592 is relatively high. Transistor 594 turning on pulls down the voltage at node C to a voltage lower than the break over voltage of zener 604. This removes any base voltage on transistor 610 thus keeping it off.

The voltage at node A continues to rise until it reaches the point represented by point S in FIG. 10. This voltage corresponds to the zener diode voltage (approximately 12 V) of transistor 574 which functions as a zener diode. Transistors 566, 568 are connected in a programmable unijunction configuration with a programmed voltage equal to the zener voltage 12 V of zener 574 plus a diode drop of 0.6 V across diode 570. The operation of programmable unijunction transistors is described in more detail in the General Electrical SCR Manual, $5^{th}$ Edition. As the voltage at node A exceeds the programmed voltage of 12.6 V, the unijunction fires in similar fashion to an SCR. Due to avalanche phenomena, the two transistors 566, 568 stay saturated as long as there is a minimum holding voltage of 2 to 3 V present.

Note that resistors 565, 567 are equal valued resistors. Thus, the voltage at node D mirrors the voltage at node A divided by two. Consequently, when unijunction transistors 566, 568 fire, the voltage at node D becomes 6.3 V. The values of the two resistors 576, 582 are chosen so that the value of resistor 582 is 10 times that of resistor 576. This causes transistor 578 to function as an emitter follower wherein its emitter voltage tracks the voltage at node A divided by two. After the unijunction fires, capacitor 588 starts to charge via the variable resistor 586.

Note that the variable resistor 586 is adjusted such that the capacitor 588 charges to the zener voltage of zener 558 within approximately 4 to 5 milliseconds. Zener 558 is coupled to capacitor 588 via resistor 559. This time corresponds approximately to point T in FIG. 10. This delay ensures that the triggering of the SCR occurs late in the descending portion of the AC cycle.

At the point T in the half cycle, the voltage across the capacitor 588 reaches the breakdown voltage of zener 558. This causes the voltage at the junction of resistor 560 and zener 558 to rise, forcing transistor 562 into saturation. This in turn pulls the base of transistor 606, i.e., node B, to virtual ground. Transistor 606, which was saturated up to this point, switches off. Transistor 606 turning off, causes the inhibit line (node C) to be released. This puts the pulse generating circuit comprising transistors 610, 624, 638 into the ready state for receiving a start pulse from the comparator circuit comprising transistor 594.

Up to now, transistor 594 was in saturation, due to its emitter bias via resistor 598 and zener 600. Although the voltage at node A started to descend, at point T it is still above the zener voltage of zener 600. Shortly thereafter, the voltage at node A drops below the reference voltage at node Y, which is approximately 6 V. This is shown at point U in FIG. 10. At this point, the transistor 594 switches off and the voltage on the collector of transistor 594 rises to the full power supply voltage of 26 V which exceeds the breakdown voltage of zener 604. This causes the voltage on the base of transistor 610 to rise to 26 V minus the voltage drop across zener 604, thus activating the pulse generating circuit.

The pulse generating circuit consists of two stages. The first stage is composed of resistors 612, 620, 622, 616, transistor 610, capacitor 614 and diode 618. The pulse created by transistor 610, through resistor 612, is delayed and narrowed by the other components. Variable resistor 616 provides adjustment for the delay and width of the pulse. The narrow negative pulse created by the first stage is used to turn off transistor 624 momentarily, thus activating the second stage. The second stage comprises of resistors 626, 630, 634, 636, transistor 624, capacitor 628 and diode 632. The pulse generated by transistor 624 is further delayed and narrowed by the components making up the second stage. The variable resistor 634 provides a similar function to variable resistor 616 in the first stage.

The narrow negative pulse created by the second stage momentarily turns transistor 638 off. While transistor 638 is off, the voltage on its collector is pulled to 26 V via resistor 640. The narrow, positive pulse PULSE_EARLY_ARC thus produced is input, via the coupling capacitor 642, to the SCR trigger circuit 236 via resistor 648. The SCR thus fires at a point V (FIG. 10) in the half cycle. The resistor 649 ties the PULSE_EARLY_ARC signal to ground potential to prevent the SCR from firing due to spurious signals.

Due to the emitter follower configuration of transistor 578, capacitor 588 will start to discharge through diode 584 and resistor 582 when the voltage at node D falls below the emitter voltage of transistor 578. The voltage across capacitor 588 closely follows the falling voltage at node D until the voltage across capacitor 588 falls below the breakover voltage of zener 558. At this time, the base of transistor 562 is removed. Transistor 562 turns off, permitting transistor 606 to turn on. This causes the pulse generating circuit to turn off. This is represented as point W in FIG. 10.

At approximately the same time, the voltage at node A drops to 2 to 3 V. This is the minimum holding voltage of the unijunction comprising transistors 566, 568 and the unijunction stops conducting. Thus, the circuit is returned to its original state before the voltage at node A reaches zero potential. In this fashion, the SCR is fired consistently when the voltage at node A descends to approximately 5 V. This corresponds to an AC line voltage across the SCR of approximately 15 V. The SCR switches off as the voltage across it approaches zero volts. The total series impedance switched by the SCR is approximately 3 ohms. This impedance is derived from the relay coil 218, capacitor 219 and resistors 220, 223. Thus, at the moment the SCR fires, the AC line is loaded with an equivalent load of approximately 5 A.

The total power dissipated by this circuit branch can be approximated as $$P = \frac{1}{2} V_M I \left[ \frac{\sin^{-1}\left(\frac{V_M}{V_{PEAK}}\right)}{180} \right]$$

$$= \frac{1}{2} \cdot 15 \cdot 5 \cdot \left[ \frac{\sin^{-1}\left(\frac{15}{170}\right)}{180} \right]$$

$$= 37.5 \cdot \frac{5}{180}$$

$$\cong 1\,W$$

This amount of dissipation can be neglected in most cases. Thus, for example, the circuit of the present invention can be placed into the housing of a standard GFCI receptacle without requiring special heat sinking.

The remainder of the early arc detection circuit functions to evaluate the quality of the AC line. Transistors 650, 654 are configured to function as a two input AND gate. The first input of the gate is the base of transistor 654 which is active high when a pulse is present at the junction of capacitor 552 and inductor 550. It is noted that the LC network comprising capacitor 552 and inductor 550 functions to produce a usable voltage pulse only when a high impedance exists on the AC line. The second input, i.e., the base of transistor 650, is active high when the output of the circuit based on transistors 624, 638 is switched on. In this way, both transistors 650, 654 turn on only when the SCR is fired and a pulse exists at node Z. When both transistors 650, 654 are on simultaneously, the capacitor 656 starts charging from the 26 VDC power supply via resistors 596, 602, 652 and diode 657.

In the case where the AC line is not degraded, i.e., low impedance, its source impedance is typically below 0.06 ohms. Thus, the voltage across the variable resistor 223 (FIG. 7) is high enough to bias transistor 658 into saturation. Note that the signal SCR_WIPE connects the base of transistor 658 to the wipe terminal of variable resistor 223. Subsequently, the capacitor 656 is discharged preventing any substantial voltage to build up. This functions to disable the alarm signal TRIG_EARLY_ARC which is input to the SCR trigger circuit 236 (FIG. 12). Note that the pulses generated across the inductor 550 are of negligible amplitude and thus could not charge capacitor 656 to any appreciable degree.

In the event the AC line is in poor condition, i.e., it has a high source impedance, a pulse is generated at node Z between the capacitor 552 and the inductor 550 when the SCR fires. When the AC line is 'poor,' its source impedance rises to approximately 3 to 5 ohms. Thus, with as little as a 10 A load, the AC line voltage drops to 90 V, which is below acceptable limits. In this case, the pulse generated across the inductor 550 is high enough to turn transistor 654 on. Further, transistor 650 turns on when the firing pulse for the SCR is generated, thus permitting the charging of capacitor 656. Due to the lower current flowing through the SCR, the voltage generated across variable resistor 223 is insufficient to turn transistor 658 on. This permits the voltage on the capacitor 656 to rise sufficiently to cause the alarm signal TRIG_EARLY_ARC to go active. Note that resistor 223 is a variable resistor thus permitting the setting of the level of AC line deterioration at which an alarm is to be generated.

The time constant of resistors 596, 602, 652 and capacitor 656 is in the order of 5 to 10 seconds. This relatively long time period provides a large amount of noise immunity. Note that although it is possible for a load to switch on at the precise time in a half cycle so as to cause capacitor 656 to be charged, the probability of this occurring during every half cycle for 5 to 10 seconds is extremely low.

Alternatively, one skilled in the electronics art could modify the circuit presented in FIG. 14 to fire the SCR after a number of half cycles, rather than every half cycle. This serves to reduce the power dissipation of the device.

Figure 11A:
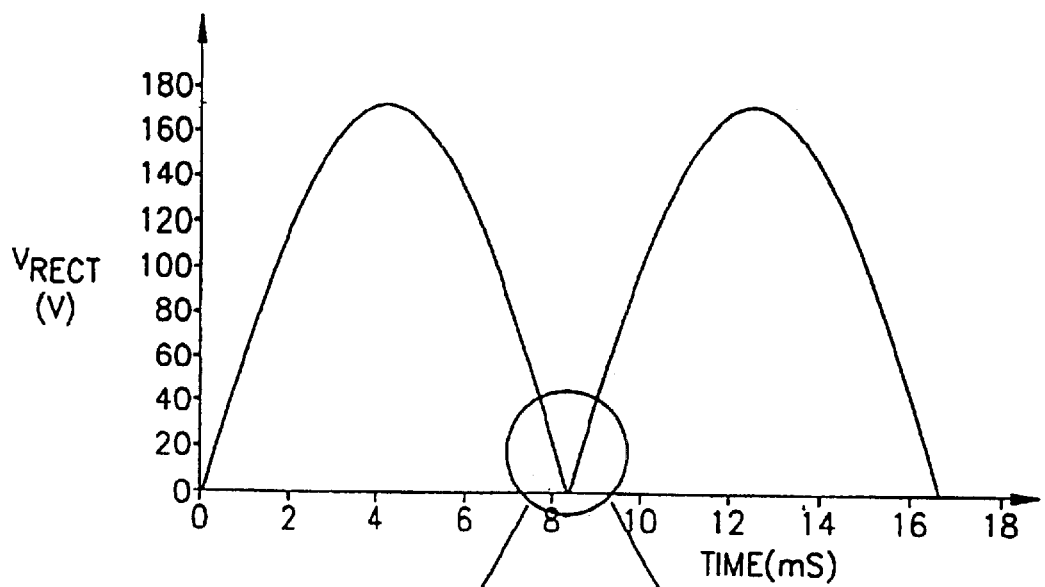
FIG. 11A is a graph illustrating the voltage $V_{RECT}$ over a full cycle of the AC cycle.
Figure 11B:
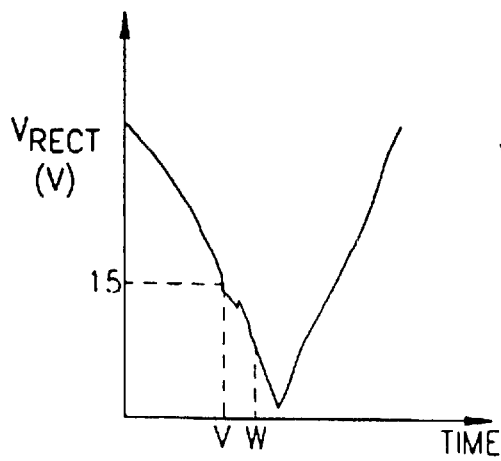
FIG. 11B is a graph illustrating the voltage $V_{RECT}$ in more detail about the zero crossing for an AC line having relatively low impedance.
Figure 11C:
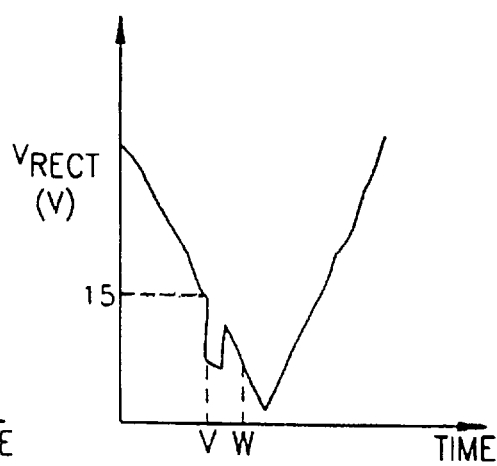
FIG. 11C is a graph illustrating the voltage $V_{RECT}$ in more detail about the zero crossing for an AC line having relatively high impedance.

A graph illustrating the voltage $V_{RECT}$ over a full cycle of the AC cycle is shown in FIG. 11A. A graph illustrating the voltage $V_{RECT}$ in more detail about the zero crossing for an AC line having relatively low impedance of 0.05 ohms is shown in FIG. 11B and for an AC line having relatively high impedance of 3 ohms is shown in FIG. 11C. The SCR 224 fires when the voltage $V_{RECT}$ reaches approximately 15 V at which time the AC line is loaded with approximately 3 ohms. If the AC line has low source impedance then the voltage $V_{RECT}$ only drops a fraction of a volt. For example, with an AC line source impedance of 0.05 ohms, the voltage $V_{RECT}$ drops an amount $\Delta V_{RECT}$ given by the following.

$$\Delta V_{RECT} = 15 - 15 \cdot \frac{3}{3 + 0.05}$$

$$\approx 0.24\,V$$

On the other hand, if the AC line has high source impedance then the voltage $V_{RECT}$ drops considerably for the short period that the SCR is on. For example, with a source impedance of 3 ohms, the voltage $V_{RECT}$ drops an amount $\Delta V_{RECT}$ given by the following.

$$\Delta V_{RECT} = 15 - 15 \cdot \frac{3}{3 + 3}$$

$$\approx 7.5\,V$$

A graph illustrating the voltage present at node Z superimposed over the voltage $V_{RECT}$ over a full cycle of the AC cycle is shown in FIG. 12A. A graph illustrating the voltage present at node Z superimposed over the voltage $V_{RECT}$ during the firing of the SCR for an AC line having relatively low impedance of 0.05 ohms is shown in FIG. 12B and for an AC line having relatively high impedance of 3 ohms is shown in FIG. 12C. The voltage at node Z is very noisy since inductor 550 is high impedance to high frequencies. In addition, the LC network causes a phase shift of the voltage at node Z relative to the AC line voltage. Capacitor 552 and inductor 550 are preferably chosen to maintain the noise below the threshold that would turn transistor 654 on. In addition, the AND gate formed by transistors 654, 650 functions to sample the voltage at node Z only when the SCR fires.

If the AC line impedance is low then the signal at node Z changes relatively little, as shown in FIG. 12B. However, if the line impedance is high, the voltage $V_{RECT}$ changes abruptly when the SCR is fired which causes the LC network to ring. The LC network comprising capacitor 551 and inductor 550 functions as an oscillator which is stable at the rate that the AC voltage is changing. However, an abrupt change in voltage, e.g., a step function, will cause the LC network to oscillate or ring at its resonant frequency. The larger the voltage step of $V_{RECT}$, the larger the oscillations of the voltage at node Z.

The ringing voltage at node Z is input to the base of transistor 654 causing it to turn on and charge capacitor 656 via diode 657. Note that transistor 654 needs to turn on multiple times in order to sufficiently charge capacitor 656 so as to activate the alarm signal TRIG_EARLY_ARC. This provides some immunity to noise and to the ringing at node Z when the AFCI/GFCI device is initially turned on.

The voltage at node Z is coupled to the base of transistor 654 via a voltage divider made up of variable resistor 553 and resistor 555. In addition, the base of transistor 654 is coupled to capacitor 557 to ground. The resistors 553, 555 and capacitor 557 improve the operation of the early arcing detection circuit. The resistors 553, 555 function as a voltage divider setting the level of the ringing voltage at which transistor 654 will turn on. The resistor 553 is variable to permit the level of the ringing voltage to be set. Note that the level of ringing voltage produced by the LC network is proportional to the height of the step generated in the voltage $V_{RECT}$ which is itself proportional to the impedance of the AC line.

The capacitor 557 functions to filter extraneous high frequency, particularly RF, from the base of transistor 654 which could otherwise possibly turn it on. Noise of a continuous, high power nature could potentially create a false indication of a high AC line impedance.

With reference to FIGS. 6 and 7, the output of transformer 269 is input to two separate circuits. One circuit being the high frequency (HF) circuit 188 comprising a high pass filter 190, full wave rectifier 192, amplifier 194 and integrator 196. The second circuit being the AC line frequency circuit 200 comprising low pass filter 202, full wave rectifier 204, amplifier 206 and integrator 208. The splitting of the output signal from the transformer 229 into two signals of different frequencies permits the device to react to different combinations of AC line frequency and high frequency arcing signals. This permits the AFCI circuit to react appropriately to many different arcing and over current situations.

Figure 13:
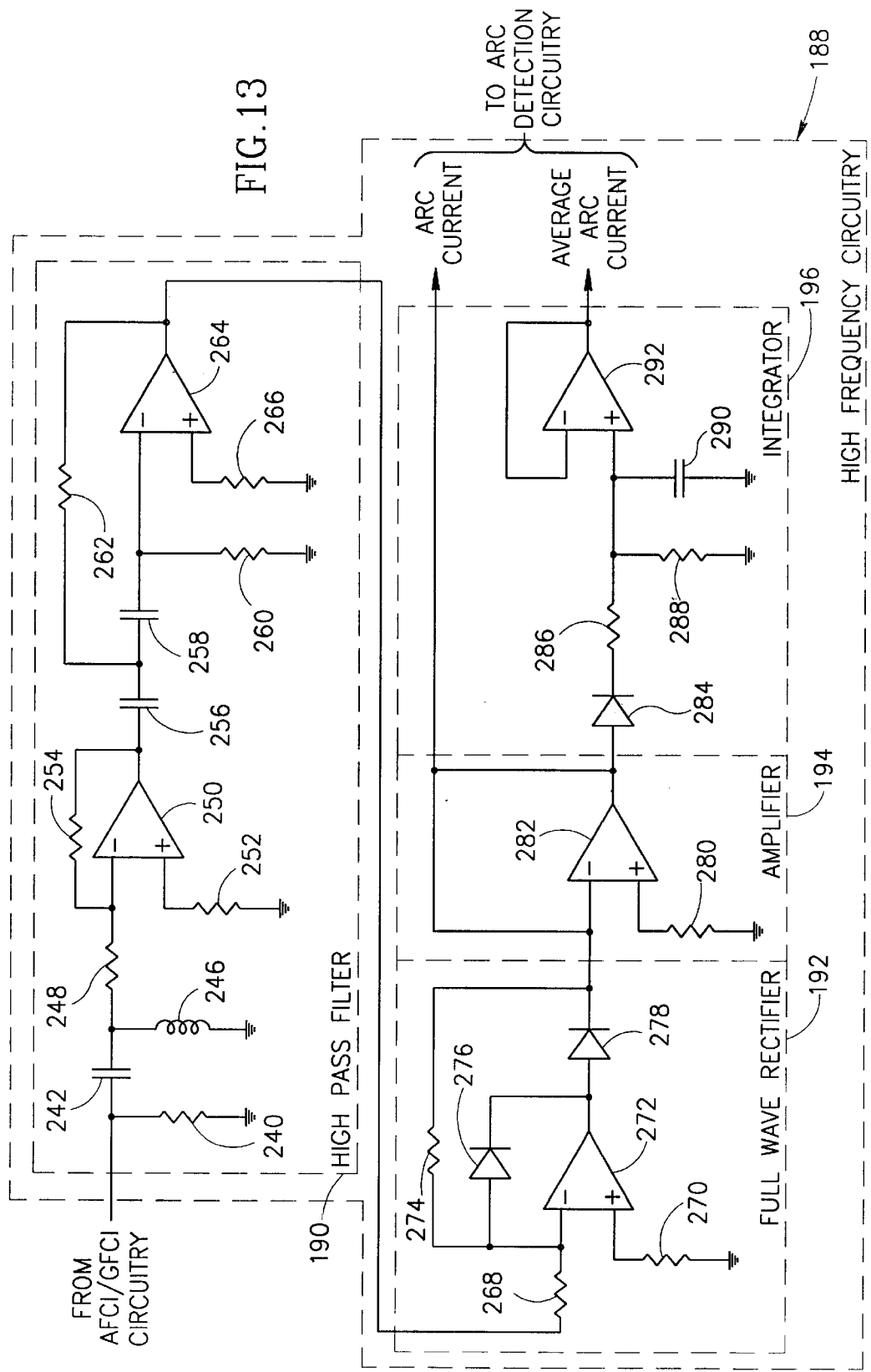
FIG. 13 is a schematic diagram illustrating the high frequency circuitry portion of the arc fault detection device of the present invention in more detail.

A schematic diagram illustrating the high frequency circuitry portion of the arc fault detection device of the present invention in more detail is shown in FIG. 13. The high pass filter 190 comprises a passive (LC network) high pass filter, an amplifier and an active op amp based high pass filter in series. The capacitor 242 is chosen so as to have negligible impedance for frequencies above approximately 500 KHz, while the inductor 246 is chosen so as to be an open circuit above 500 KHz. Thus, high frequencies pass through the filter. At low input frequencies, capacitor 242 has a high impedance and inductor 246 appears as a virtual short to ground, thus severely attenuating low frequency signals. The resistor 240 helps to prevent the LC network consisting of capacitor 242 and inductor 246 from resonating by dampening oscillations. Thus the LC network functions as a high pass filter whose output is input to operational amplifier 250.

The gain of the op amp 250, defined by resistors 248 and 254, is set to provide a suitable functional range of high frequency arcing signals for later signal processing operations. The resistor 252 provides temperature compensation, permitting the detector to operate at temperatures higher than room temperature without any loss of accuracy. The op amp 250 also functions as a buffer, producing a low impedance source for the series connected filter constructed around op amp 264.

This filter comprises a two pole, active high pass Chebychev filter with a cut off frequency of approximately 500 KHz. This filter provides high attenuation of signals below 500 KHz, thus preventing power line carrier communication signals present on the AC line (which might reach frequencies as high as 400 KHz) from interfering with the detection of arc faults. The filter is constructed from capacitors 256, 258, resistors 262, 260 and op amp 264. The resistor 266 is utilized for temperature compensation.

The output of the Chebychev filter is input to a full wave rectifier 192 which is capable of rectification at input voltages in the millivolt range. The rectifier 192 comprises an op amp 272 whereby the positive input of the op amp is held to ground via resistor 270. The diodes 276, 278 provide rectification of the signal. Due to the feedback via resistor 274, no loss in signal is achieved. Resistors 268, 274 define the gain of the rectification stage 192.

The pulsating high frequency DC signal output by the full wave rectifier 192 is input to an amplifier 194 comprising op amp 282 and resistor 280. The amplifier 194 functions as a voltage follower or impedance matching buffer providing a low resistance source for the arc current signal which is representative of the peak level of arc current on the AC line. The arc current signal is the voltage of the high frequency processed signal, containing all the peaks and troughs of the original signal. If this voltage is excessively high, the device will trip the relay.

The output of the amplifier 194 is input to the integrator 196 which functions to generate a signal representative of the level of the average peak arc current present on the AC line. The integrator preferably has an integration time of approximately 100 ms. The buffered signal output from the full wave rectifier 192 is smoothed and averaged via diode 284, resistors 288, 286 and capacitor 290. Resistor 286 and capacitor 290 are sufficiently large to smooth out the rapid fluctuations of the high frequency arcing signal and convert them to a slower moving DC level suitable for the arc detection circuit 198 (FIG. 6). The resulting averaged arc current signal is output via the voltage follower/buffer 292.

A schematic diagram illustrating the AC line frequency circuitry portion of the arc fault detection device of the present invention in more detail is shown in FIG. 14. In contrast to the high frequency circuitry 188 of FIG. 13, the AC line frequency circuitry 200 of FIG. 14 performs low pass filtering. The input LC network of the low pass filter 202 comprising capacitor 302 and inductor 300 functions as a low pass filter. Frequencies less than 500 Hz are passed with negligible attenuation. At these frequencies, inductor 300 is virtually a short circuit and capacitor 302 has high impedance. At frequencies above 500 Hz, the inductor 300 is high impedance and the capacitor 302 has low impedance thus severely attenuating any high frequency content in the input signal. The resistor 240 (FIG. 13) also prevents this second LC network from resonating as well.

The output of the LC network is input to an amplifier constructed from op amp 308 and resistors 304, 306, 310. The gain of the op amp 308, defined by resistors 304, 306, is set so that the AC line frequency circuitry 200 provides 1 V per 10 A flowing on the AC power line. This precise current to voltage relationship permits the circuitry to accurately detect and reject the low level arcing produced by common appliances connected to the AFCI/GFCI device. The resistor 310 provides temperature compensation in a similar manner to the resistor 252 (FIG. 13). The op amp circuit 308 also functions as a buffer producing a low impedance output source for the filter constructed around op amp 322.

The filter coupled in series with op amp circuit 308 is a two pole, active low pass Chebychev filter with a cut off frequency of approximately 500 Hz. The use of an active filter provides a much sharper cut off of high frequencies. The low pass filter is constructed from the resistors 312, 316, 320, capacitors 314, 318 and op amp 322.

The output of the Chebychev filter is input to a full wave rectifier 204 which is capable of rectification at input voltages in the millivolt range. The rectifier 204 comprises an op amp 330 whereby the positive input of the op amp is held to ground via resistor 329. The diodes 328, 332 provide rectification of the signal. Due to the feedback via resistor 326, no loss in signal is achieved. Resistors 324, 326 define the gain of the rectification stage 204.

The pulsating low frequency DC signal output by the full wave rectifier 204 is input to an amplifier 206 comprising op amp 336 and resistor 334. The amplifier 206 functions as a voltage follower or impedance matching buffer providing a low resistance source for the AC line current signal which is representative of the peak level of AC line current on the electrical line that the AFCI/GFCI device is monitoring.. The AC line current signal is the voltage of the low frequency processed signal, containing all the peaks and troughs of the original signal. If this voltage is excessively high, the device will trip the relay.

The output of the amplifier 206 is input to the integrator 208 which functions to generate a signal representative of the level of the average peak AC line current. The integrator preferably has an integration time of approximately 100 ms. The buffered signal output from the full wave rectifier 204 is smoothed and averaged via diode 340, resistors 338, 342 and capacitor 344. Resistor 338 and capacitor 344 are sufficiently large to smooth out the fluctuations of the AC line frequency signal and convert them to a slower moving DC level suitable for the arc detection circuit 198 (FIG. 6). The capacitor 344 is slowly discharged by resistor 342. The resulting averaged arc current signal is output via the voltage follower/buffer 346.

The resistors and capacitors in the averaging circuit 208 are preferably chosen to attenuate the signals generated by the inrush currents of typical household appliances which contain, for example, electric motors, incandescent lamps and switching power supplies. The inrush currents generated by these appliances produce a short duration voltage spike which decays very quickly after the appliance is turned on.

Thus, the AC line frequency circuitry 200 outputs two signals, the first signal being proportional to the peak AC line current flowing in the power line and the second signal being proportional to the average AC line current flowing in the power line. The high frequency circuitry 188 also outputs two signals, the first signal being proportional to the peak current of frequency components above 500 KHz (with the highest frequency limited by the physical characteristics of the components and op amps utilized) and the second signal being proportional to the average current of frequency components above 500 KHz. All four of these signals are utilized by the arc detection circuit 198 (FIG. 6) to permit the AFCI/GFCI device to react appropriately to a wide range of dangerous conditions. Use of the four signals also permits the device to disregard both inrush currents and noise typically generated by household appliances, while reliably detecting dangerous arcing conditions.

Alternatively, it may be possible to remove either the initial passive LC type filtering or the active filtering (op amps) and still provide sufficient filtering of the AC line frequency signal and any high frequency arcing signals for the device to work as intended. Ensuring the attenuation of any signals in the frequency bands used for power line carrier communications would also be a consideration.

Figure 15A:
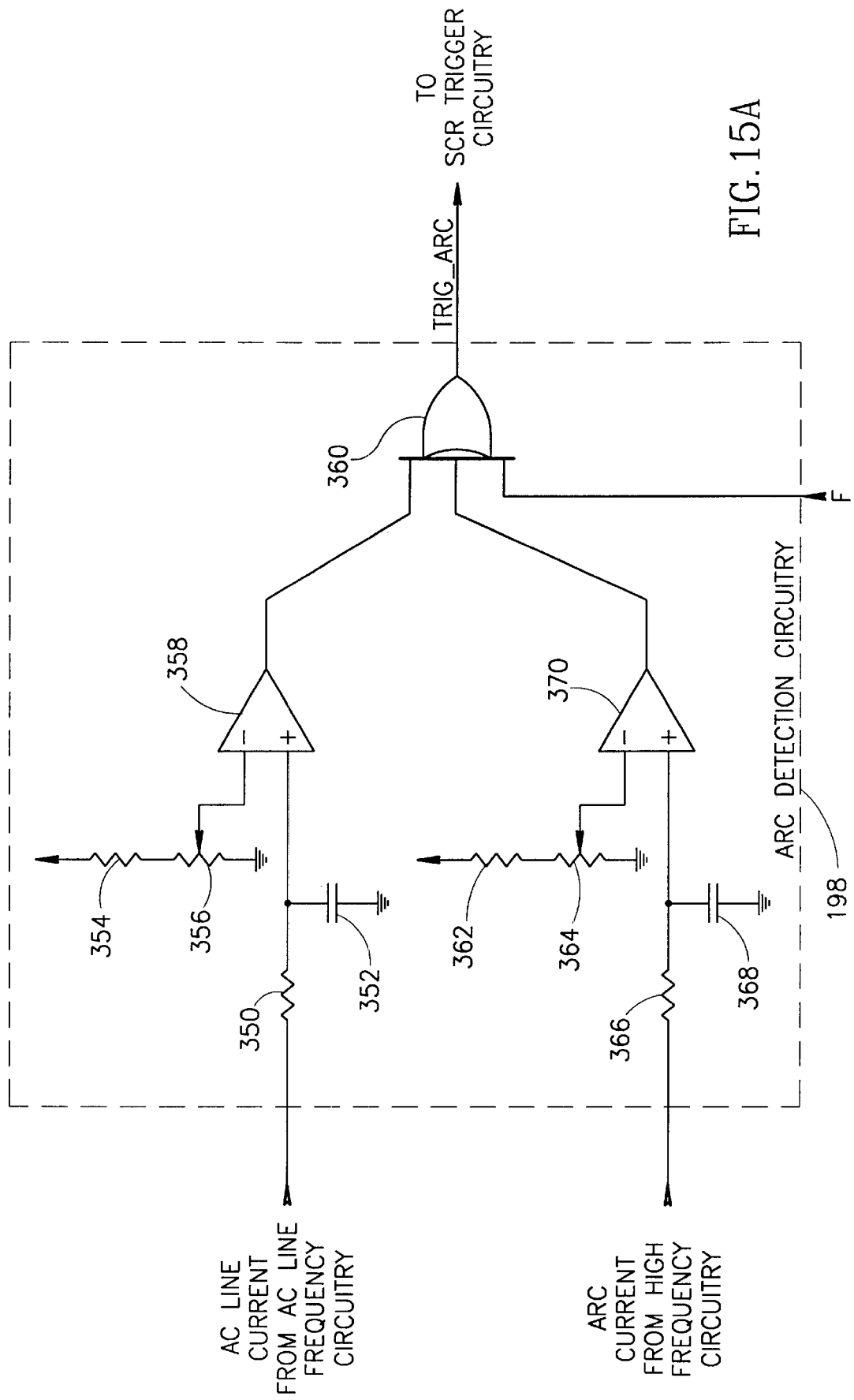
FIGS. 15A, 15B and 15C are schematic diagrams illustrating the arc detection circuitry portion of the arc fault detection device of the present invention in more detail.
Figure 15B:
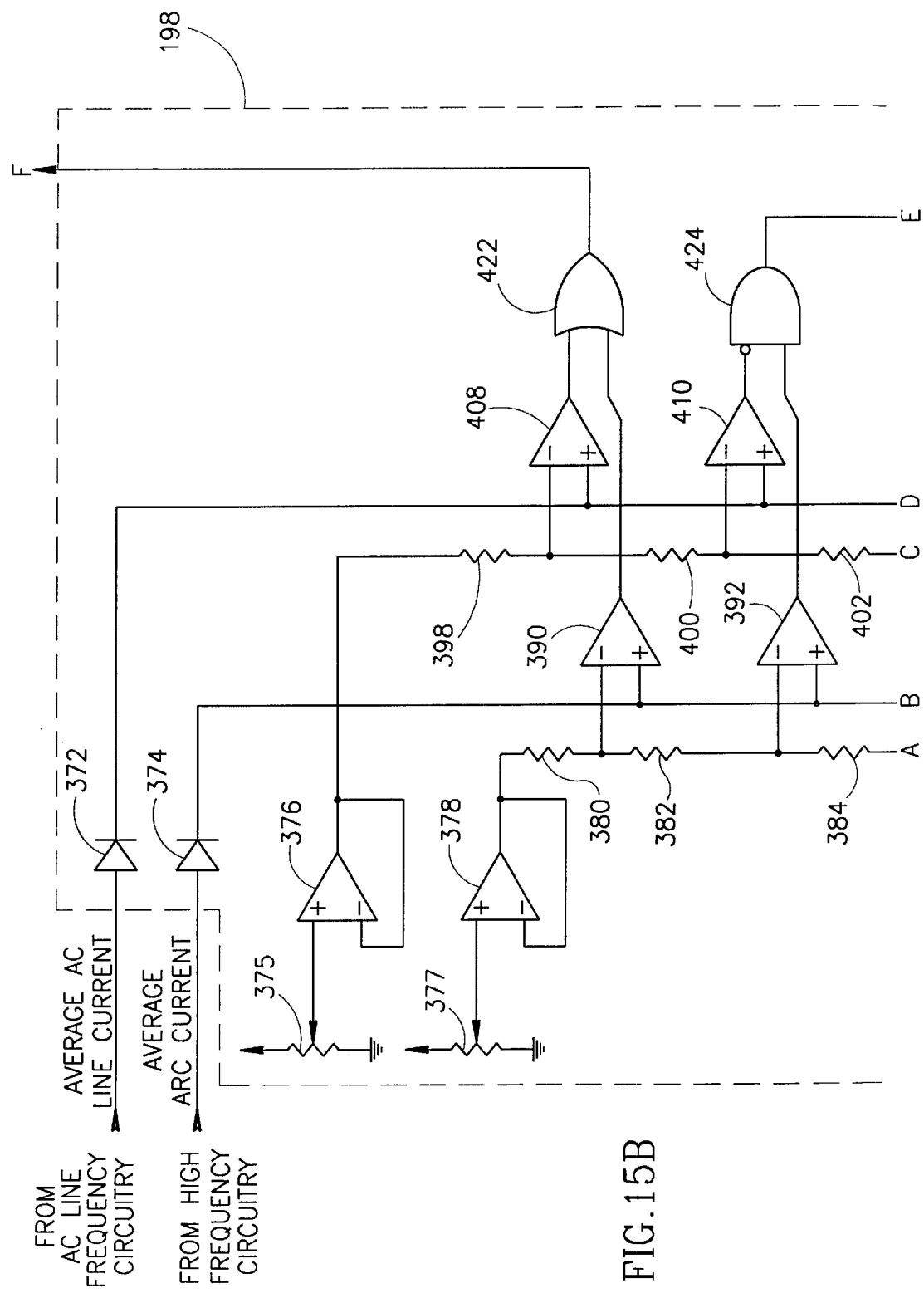
Figure 15C:
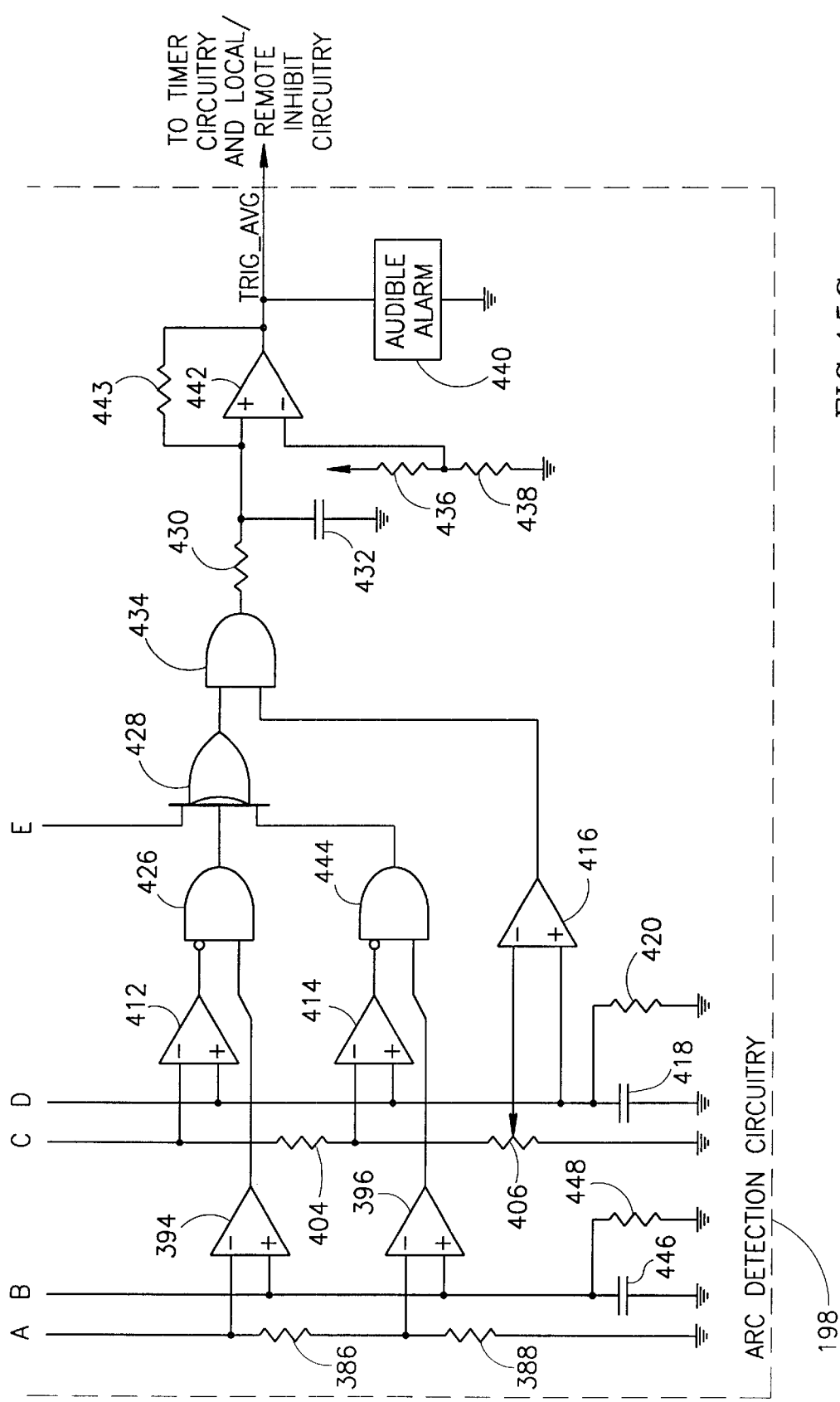

Schematic diagrams illustrating the arc detection circuitry portion of the arc fault detection device of the present invention in more detail are shown in FIGS. 15A, 15B and 15C. The arc detection circuitry functions to generate two trigger signals termed TRIG_ARC and TRIG_AVG. The generation of the first signal TRIG_ARC will be described first. With reference to FIG. 15A, the arc detection circuitry is operative to detect when the peak AC line frequency current or the peak high frequency arc current is above a predetermined threshold that has been determined to be unsafe. The peak AC line frequency current from the AC line frequency circuitry 200 (FIG. 14) is smoothed via resistor 350 and capacitor 352 before being input to comparator 358. The minus input of the comparator is the output of a voltage divider which serves as a reference voltage. Resistor 354 and pot 356 form the voltage divider. This reference voltage is set to a value representing the highest permissible peak AC line current on the AC line. Preferably, the highest permissible peak AC line current is 100 A. When the AC line frequency peak voltage is higher than the set threshold, the normally low output of the comparator 358 will go high. If the other inputs to the OR gate 360 were previously low then comparator 358 going high causes the signal TRIG_ARC to go high. This, in turn, causes the SCR trigger circuit 236 (FIG. 7) to trigger the SCR and open the relay, disconnecting the power to the load. This circuit is particularly useful for detecting short duration, hazardous arcing, where appreciable load current is flowing through the arc and the power line such as when an extension cord is cut by the sharp edge of a metal chair leg.

Similarly, the peak high frequency current from the high frequency circuitry 188 (FIG. 13) is smoothed via resistor 366 and capacitor 368 before being input to comparator 370. The minus input of the comparator is the output of a voltage divider which serves as a reference voltage. Resistor 362 and pot 364 form the voltage divider. This reference voltage is set to a value representing the highest permissible peak high frequency arc current on the AC line. When the high frequency peak voltage is higher than the set threshold, the normally low output of the comparator 370 will go high. If the other inputs to the OR gate 360 were previously low then comparator 370 going high causes the signal TRIG_ARC to go high. This, in turn, causes the SCR trigger circuit 236 (FIG. 7) to trigger the SCR and open the relay, disconnecting the power to the load. This circuit is particularly useful for detecting short duration, hazardous arcing, where appreciable load current is flowing through the arc and the power line such as when an extension cord is cut by the sharp edge of a metal chair leg.

Both the peak AC line frequency and peak high frequency comparator circuits are preferably constructed such that the relay in the AFCI/GFCI will trip within approximately three AC cycles, i.e., 40 ms, when 100 A of arcing and/or AC line over current conditions are detected. This level of detection and speed of tripping is termed Level 3 priority. The two other levels, Levels 2 and 1 are lower in priority and consequently more time is needed before the relay is tripped.

The quick response associated with Level 3 priority arcing and over current situations is achieved by using the peak voltages output from the AC line and high frequency circuits rather than the average voltages. This provides an instant tripping reaction to excessive inrush currents. In addition, it also provides extra margin for detecting very large arcs, as these have a large AC line frequency component and a sufficient amount of energy to start a fire quite rapidly.

The novel approach to arc detection utilized in this invention provides very fast response to a wide range of dangerous scenarios. The device utilizes the two comparators 358, 370 to quickly turn off the AC power to the load in the following three different situations: (1) when the line has high levels of arcing (2) when the peak AC line current exceeds the line's capacity and (3) when the line is overloaded due to excessive arcing.

Figure 16:
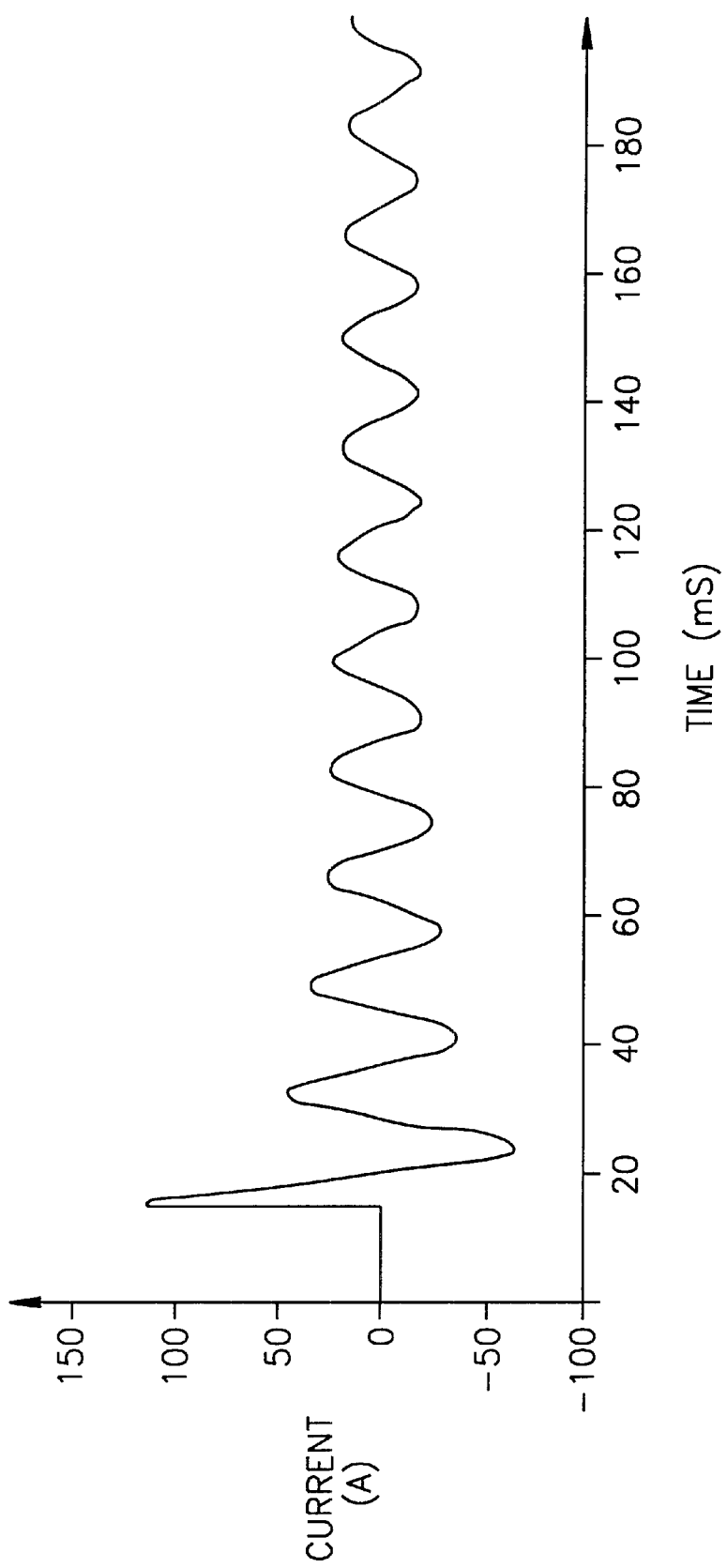
FIG. 16 is a graph illustrating the inrush current versus time for a 15 A incandescent lamp load.

Normal inrush currents associated with motors and incandescent bulbs, for example, though short in duration, can be very high. A graph illustrating the magnitude of inrush current versus time for an incandescent lamp is shown in FIG. 16. A 15 A incandescent load was connected to the load side of the AFCI/GFCI and the inrush current was measured. A peak inrush current of approximately 130 A was measured. This peak inrush would normally generate sufficient voltage to trip the AFCI/GFCI. However, capacitors 352 and 368 (FIG. 15A) generate a time delay. The values of capacitors 352, 368 are chosen to provide a time delay of approximately 25 ms for the comparators 358, 370, respectively. As can be seen from the graph in FIG. 16, after approximately 10 ms the peak current has dropped to below 80 A. This time delay prevents false tripping by inrush currents, as comparators 358, 370 are configured to trip within 40 ms at 100 A load current.

The next lower priority level, Level 2, is associated with high average arcing, i.e., average AC line frequency current or average high frequency arc current greater than 1.5 times the rating of the AFCI/GFCI. At this priority level the comparator circuit is preferably such that the relay in the AFCI/GFCI device will trip within 100 ms. Note that the user cannot disable arc detection at Levels 2 and 3 priority since it is desirable that the AFCI/GFCI device always trip in the presence of conditions that are determined to be dangerous.

The circuitry used to implement Level 2 priority will now be described in more detail. With reference to FIG. 15B, the average AC line current from the AC line frequency circuitry is input to the plus input of the comparator 408. A voltage reference source is input to the minus input of the comparator 408. The reference voltage is generated via pot 375 and op amp 376 which forms a voltage regulating circuit. The voltage regulating circuit provides the adjustable reference voltage for a resistive divider network which comprises resistors 398, 400, 402, 404, 406. The values of the resistors are chosen so as to create multiple reference levels of average AC line frequency current, e.g., 30, 20, 10, 5 and 2.5 A. The reference voltage created at the minus input to comparator 408 corresponds to an average AC current of 30 A on the AC line. Thus, if the level of average AC line current detected is above 30 A, the output of the comparator 408 goes high causing the output of the OR gate 422 to go high. The output of OR gate 422 is input to the OR gate 360 which functions to output the TRIG_ARC signal to the SCR trigger circuit.

Similarly, a voltage reference source is input to the minus input of the comparator 390. The reference voltage is generated via pot 377 and op amp 378 which forms a voltage regulating circuit. The voltage regulating circuit provides the adjustable reference voltage for a resistive divider network which comprises resistors 380, 382, 384, 386, 388. The values of the resistors are chosen so as to create multiple reference levels of arcing current, e.g., dangerous, high, medium and low. The reference voltage created at the minus input to comparator 390 corresponds to a dangerous arcing level. Thus, if the level of average high frequency current detected is above this level, the output of the comparator 390 goes high causing the output of the OR gate 422 to go high. The output of OR gate 422 is input to the OR gate 360 which functions to output the TRIG_ARC signal to the SCR trigger circuit.

The two comparators 390, 408 are configured to output a high in the presence of unsafe conditions. They are connected through OR gates to the SCR trigger circuit controlling the AFCI/GFCI relay. This provides Level 2 priority tripping with a trip time of approximately 100 ms. This fast trip cannot be disabled nor delayed by the user, as it is the case with Level 1 priority detection.

The output of comparator 390 goes high if unsafe arcing persists for approximately 100 ms, while the output of comparator 408 goes high if the total average current exceeds 30 A for a time duration of approximately 100 ms, i.e., six AC cycles. An average AC line current of 30 A indicates that the AFCI/GFCI safe feed through current capability is being exceeded by 50 to 100%. Note that typical GFCIs are rated for 15 to 20 A AC feed through current. When these circumstances occur, the power to the load is shut off. It is noted that average AC line and high frequency signals are used as inputs to reduce the sensitivity of the tripping action of the AFCI/GFCI to the current waveform or its frequency. Thus, the type of arc detected or the type of load powered through the AFCI/GFCI does not effect the ability of the device to trip when dangerous conditions occur. The comparator 390 reacts to high frequency currents while comparator 408 reacts to AC line frequency, i.e., 50 or 60 Hz. The output of comparator 408 goes high when the average current exceeds 30 A on the AC power line. In this fashion the device provides over current protection against continuous overloading, as well as protection against excessive peak currents exceeding 100 A for longer than 2 to 3 AC cycles.

The arc detection circuitry also comprises two banks of comparators, one associated with the average AC line current and the other associated with the average high frequency arcing current. Three comparators 410, 412, 414 have their minus inputs tapped into different reference voltage levels generated by the resistor divider 398, 400, 402, 404. The plus input of each comparator is coupled to the average AC line current voltage. The resistor values are chosen so that the output of comparator 410 will go high when the average AC line current exceeds 20 A, the output of comparator 412 will go high when the average AC line current exceeds 10 A and the output of comparator 414 will go high when the average AC line current exceeds 5 A. As previously described, the output of the comparator 408 will go high when the average AC line current exceeds the dangerous level of 30 A.

The average AC line current signal is fed to comparators 408, 410, 412, 414 through diode 372. A capacitor 418 provides further smoothing of the average AC line current signal and resistor 420 ensures that capacitor 418 discharges when the average AC line current decreases. Additional feedback resistors can be added to the plus inputs of the comparators to provide hysteresis thus reducing oscillations.

Similarly, the arc detection circuit comprises comparators 392, 394, 396 for detecting various levels of average arcing current on the line. The minus inputs of each of the comparators is coupled to different taps on the voltage divider which comprises resistors 380, 382, 384, 386, 388. The values of the voltage divider resistors are calculated to switch the output of the comparator 396 high when the average arcing current level exceeds a 'low' level. A 'low' arcing level is defined as the minimum arcing level required to start a fire. The output of the comparator 394 goes high when the average arcing current exceeds a 'medium' level. The output of the comparator 392 goes high when the average arcing current level exceeds a 'high' level. As previously described, the output of the comparator 390 goes high when the average arcing current level exceeds a level considered 'dangerous' under any circumstance. A 'dangerous' level is defined as the amount of arcing that would produce an average arcing current of 30 A.

The average arcing current voltage signal is fed to comparators 390, 392, 394, 396 through diode 374. The capacitor 446 provides further smoothing of the average arc current signal and resistor 448 provides a discharge path for capacitor 446. Additional feedback resistors can be added to the plus inputs of each of the comparators to provide hysteresis thus reducing oscillations.

Note that the integrator circuits in the AC line and high frequency circuitry that provide the input to the arc detection circuitry create a time delay of approximately 85 to 100 ms. The time delay prevents the relay from tripping and disconnecting the power during a current inrush, which always occurs when inductive, capacitive or incandescent loads are turned on (FIG. 16).

Alternatively, a delayed tripping mechanism is provided for signals with lower average arcing. These signals are given Level 1 priority. Level 1 is the lowest priority and the AFCI/GFCI will trip within 1 to 2 seconds at this level of arcing. In addition, the user has the option of delaying or preventing tripping due to Level 1 arcing through the timer circuit described in more detail hereinbelow. The user can also enable an audible warning device rather than have the AFCI/GFCI trip.

Various levels of detection are provided by the two comparator configurations 390, 392, 394, 396 and 408, 410, 412, 414. The device is able react appropriately to different levels of average AC line current and average arc current by applying the output of the comparators to a logic circuit.

In particular, the comparators 392, 410 are associated with high level are detection, comparators 394, 412 with medium level arc detection and comparators 396, 414 are associated with low level arc detection. These various levels of arcing produce a Level 1 priority trip. Below a certain average arcing current level, an arc can be considered non dangerous because it has insufficient energy to start a fire. An example of non dangerous arcing is a static electricity discharge. The reference voltage provided to comparator 396 by the voltage divider represents an average arcing current level containing the minimum amount of energy to start a fire. This is the lowest detection point and has been experimentally determined by analyzing many arcing wave signatures.

The reference voltage for comparator 414 is preferably set to 0.5 V. This reference voltage is calculated to equal the DC voltage of the average AC line current signal when 5 A of current flows on the load side of the AFCI/GFCI device. When the average arc current signal reaches the minimum level required to be dangerous, i.e., 'low' level, the output of comparator 396 goes high. The output of the comparator 396 is input to one input of the AND gate 444. The output of comparator 414 is inverted and input to the second input of the AND gate 444. Thus, the output of AND gate 444 is high only when the a 'low,' i.e., minimum dangerous, arcing level is detected and less than 5 A flows in the load line.

The reference voltage for comparator 412 is preferably set to 1 V. This reference voltage is calculated to equal the DC voltage of the average AC line current signal when 10 A of current flows on the load side of the AFCI/GFCI device. When the average arc current signal reaches the 'medium' level, the output of comparator 394 goes high. The output of the comparator 394 is input to one input of the AND gate 426. The output of comparator 412 is inverted and input to the second input of the AND gate 426. Thus, the output of AND gate 426 is high only when the 'medium' arcing level is detected and less than 10 A flows in the load line.

The reference voltage for comparator 410 is preferably set to 2 V. This reference voltage is calculated to equal the DC voltage of the average AC line current signal when 20 A of current flows on the load side of the AFCI/GFCI device. When the average arc current signal reaches the 'high' level, the output of comparator 392 goes high. The output of the comparator 392 is input to one input of the AND gate 424. The output of comparator 410 is inverted and input to the second input of the AND gate 424. Thus, the output of AND gate 424 is high only when a 'high' arcing level is detected and less than 20 A flows through the load line.

The table below summarizes the average arcing required for the various priority trip levels. Note that peak AC line current or peak high frequency arcing current is excess of 100 A will immediately trip the device. This is a Level 3 priority trip. The following table only describes average current trip levels.

| Average AC Line Current | Average High Frequency Arc Current | | | | |
| --- | --- | --- | --- | --- | --- |
| | None | Low | Medium | High | Dangerous |
| <2.5 A | No Trip | No Trip | No Trip | No Trip | Level 2 |
| <5 A | No Trip | Level 1 | Level 1 | Level 1 | Level 2 |
| <10 A | No Trip | No Trip | Level 1 | Level 1 | Level 2 |
| <20 A | No Trip | No Trip | No Trip | Level 1 | Level 2 |
| <30 A | No Trip | No Trip | No Trip | No Trip | Level 2 |
| ≧30 A | Level 2 | Level 2 | Level 2 | Level 2 | Level 2 |

Note that the example arc detection circuit of FIGS. 15A, 15B and 15C is shown comprising three levels of average arc current detection, i.e., high, medium and low, for illustrative purposes only. Higher or lower levels of average arc current detection are possible without departing from the scope of the invention. Alternatively, since relatively slowly changing DC levels are involved, A/D converters could be utilized to digitize the average Ac line and high frequency signals for input into a microcontroller. The microcontroller would be suitably programmed to generate an output dependent upon the levels of the two input signals. The microcontroller could also perform a hysteresis function in software for each detection level.

As described above, the output of each of the AND gates goes high only if the average arc current detected is greater than the level permitted for a particular level of average AC line current. This also implies that for every level of average AC line current, there is a level of average arc current which is tolerated, e.g., as a byproduct of the particular load such as vacuum cleaners, electric shavers, food processing appliances, etc. These common appliances each have an amount of arcing associated with their operation. The level of arcing signal produced by these appliances is generally lower than the signal from an uncontrolled arc with the same current flow. Thus, because the arc detection circuitry tolerates a specific amount of arcing for each level of AC line current, false tripping of the device is prevented whenever these types of appliances are used.

The outputs of the AND gates 424, 426, 444 are input to an OR gate 428. If any of the outputs of the AND gate go high, the output of the OR gate 428 goes high. The output of the OR gate 428 is input to AND gate 434.

An additional comparator 416 is included in the arc detection circuit to eliminate any false tripping due to noise on the AC line. The noise may be created by spikes generated by various sources, RF pickup or electrostatic discharge such as when someone walks on a dry nylon carpet and touches the housing of an outlet or extension cord. In addition, an appliance like an electric shaver, may generate a substantial amount of arcing noise yet consume minimal current thus falsely tripping the device. The comparator 416 causes the above type disturbances, white noise, light dimmer noise, etc. to be ignored, therefore increasing the noise immunity of the arc detector.

The comparator 416 is at the lowest position on the totem pole structure for average AC line current detection. The reference voltage, input to the minus input of the comparator, is set by the variable resistor 406. Comparator 416 functions to keep the output of AND gate 434 low when less than a minimum current level is flowing through the AFCI/GFCI. The output of the AND gate 434 can only go high if the average AC line current is above a minimum level. In the example presented herein, this level is arbitrarily set to 2.5 A. Thus, only arc faults that contain sufficient energy to start a fire will trip the arc detector.

As is well known, electrical energy is represented as $P=I^2R$ or $VI$, therefore as I approaches zero the energy in an arc approaches zero. Hence, the power becomes negligibly small and it can be considered a static arc. As an illustrative example, walking on a dry nylon carpet can produce static voltages as high as 50,000 V yet the current is only a few $\mu A$. Thus, the total energy in the arc is in the mW range which is not sufficient to start a fire.

The output of the AND gate 434 is input to the plus input of comparator 442 via resistor 430 and capacitor 432. The resistor 430 and capacitor 432 function to generate a delay of 1 to 2 seconds. Small short lived arcs that persist for longer than 100 ms, but are not continuous, are not normally dangerous. The 1 to 2 second delay causes these intermittent arcs to be ignored, e.g., those produced by opening and closing switches. The delay also provides greater noise immunity from sporadic or short lived noise sources such as lighting controls. The output of comparator 442 goes high when the voltage on the capacitor 432 exceeds the reference voltage set by the divider 436, 438. Hysteresis is provided by resistor 443 which prevents the comparator from oscillating. The comparator 442 also functions as a buffer for the following stages. The output of comparator 442 is input to the timer circuitry and local/remote inhibit circuitry. In addition, the output of the comparator 442 can optionally be input to an audible alarm 440 which can comprise a buzzer or other type of well known audible alarm device. Optionally, a user controlled switch can be connected to the output of the comparator 442 to provide the option of driving the audible alarm indicating a Level 1 priority arc fault or to trip the device via the timer circuitry described hereinbelow.

A problem associated with prior art AFCIs is that they annoyingly trip when equipment or appliances that produce heavy arc like signals, e.g., arc welders, are used. The present invention comprises timer circuitry 186 (FIG. 6) which functions to temporarily disable the detection of arc faults for a period of time such as minutes or even hours. The detection of any arcing during the time that the detector output is disabled, causes the period of disablement to extend by a time equal to the total time that arcing is detected. Thus, if arc detection is disabled for one hour and 10 minutes, and arcing is detected during that time, the detector becomes enabled one hour and 10 minutes later. In this manner, arc detection can be remain disabled for longer periods of time thus permitting the user uninterrupted use of the equipment or appliance.

Figure 17:
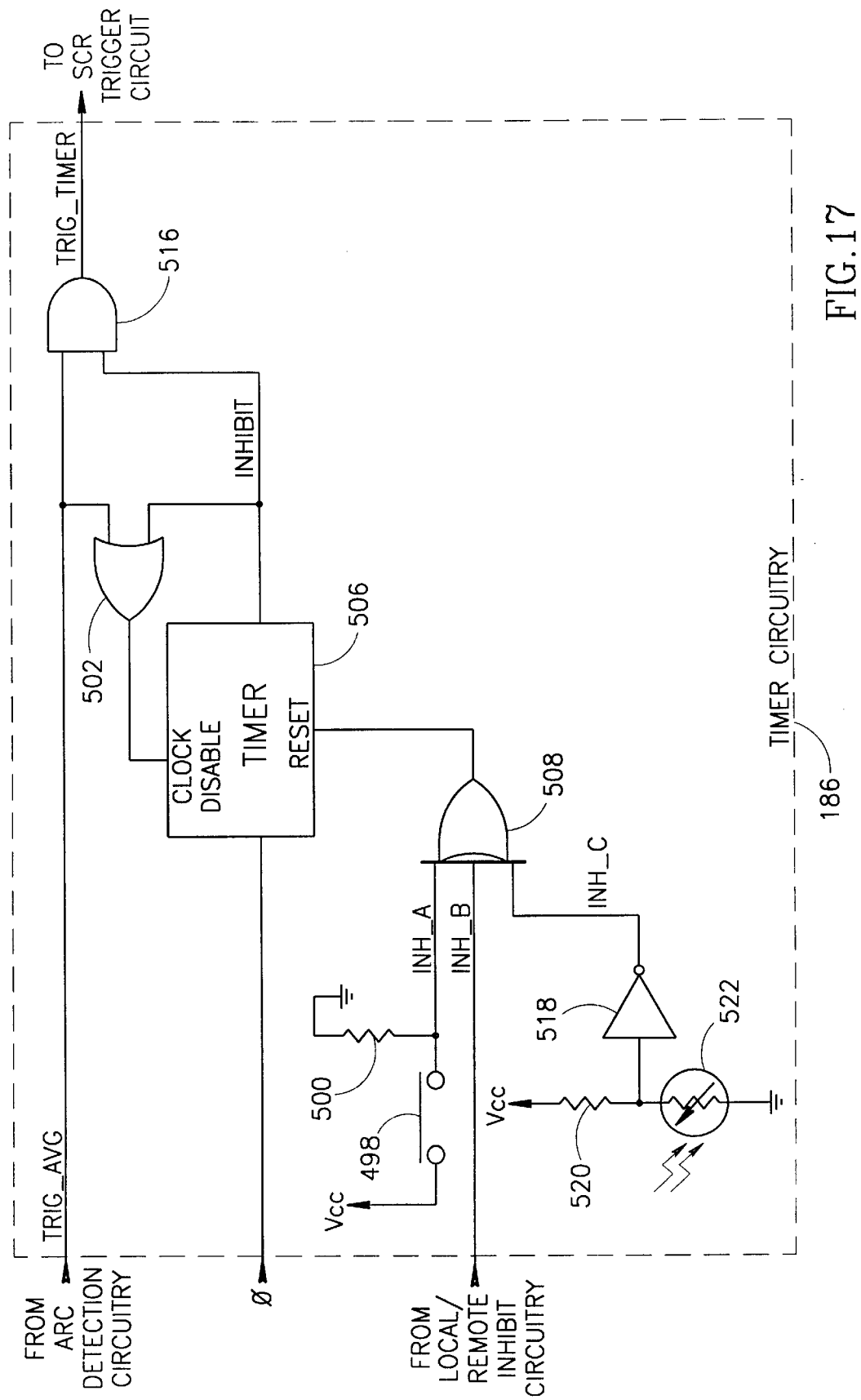
FIG. 17 is a schematic diagram illustrating the timer circuitry portion of the arc fault detection device of the present invention in more detail.

A schematic diagram illustrating the timer circuitry portion of the arc fault detection device of the present invention in more detail is shown in FIG. 17. The function of the timer circuitry 186 is to generate an active low $\overline{INHIBIT}$ signal that is gated with the Level 1 priority related $TRIG_{AVG}$ signal output by the arc detection circuitry. The $\overline{INHIBIT}$ signal is generated by a timer 506 and is normally high. The $\overline{INHIBIT}$ signal is gated with the TRIG__AVG signal via AND gate 516 to generate the TRIG__TIMER signal. The TRIG__TIMER signal is then input to the SCR trigger circuit 236 (FIG. 7). Since the output of the timer is normally high, the TRIG__AVG signal is normally enabled so that the relay can trip. The application of an active high pulse to the RESET input of the timer starts the timer running. When a pulse is applied the reset input, the $\overline{INHIBIT}$ signal is pulled low until the timer count reaches a specified number of clock cycles. During the time that the $\overline{INHIBIT}$ signal is low, the TRIG__TIMER signal is disabled. After the disablement of the timer ends, the $\overline{INHIBIT}$ signal returns to its active high state.

The 50 or 60 Hz phase conductor of the AC line serves as the clock source for the timer 506. The timer comprises zero detecting means, well known in the art, for detecting the zero crossings of the AC wave which forms the timer input clock signal. Within the timer, the 50 or 60 Hz high voltage sine wave is converted to a low voltage square wave of the same frequency. The timer also comprises counting means, such as a plurality of Johnson counters. The internally generated square wave is used as the clock input for the counters. By suitable selection of the counter means, any time period can be arbitrarily generated by the timer. For example, with 60 Hz AC power and a divide by 216,000 counter, the timer output returns to a high state one hour after being reset.

A gate (not shown) separates the clock generator from the counters within the timer. This gate is controlled by an input labeled CLOCK DISABLE, which is internally latched. When the CLOCK DISABLE input is high, the clock is prevented from driving the counters. Thus, the timer is 'paused' until the CLOCK DISABLE input is removed. When the CLOCK DISABLE input is returned to active low the timer resumes counting from the point at which it paused.

The timer also comprises a RESET input. An active high pulse on the RESET input forces the output of the timer, i.e., the $\overline{INHIBIT}$ signal, low and sets all the counter registers to zero. The timer is preferably of the resetable type, i.e., it can be made to start counting from zero at any time, even during counting. A continuous active high on the RESET input will keep the counter at zero and therefore keep the $\overline{INHIBIT}$ signal permanently low.

When the $\overline{INHIBIT}$ signal is high, the CLOCK DISABLE input of the timer is pulled high via the output of OR gate 502. This prevents the timer from counting further and latches the timer in a high output state.

As described previously, the detection of a priority Level 1 arc fault will extend the period of disablement. Assuming the $\overline{INHIBIT}$ signal is low, i.e., the timer is counting, a high TRIG__AVG signal will produce a high at the CLOCK DISABLE input of the timer-through the OR gate 502. Thus, the timer pauses for the period of time that the TRIG__AVG signal is high. This means that the re-enabling of the TRIG__TIMER signal is delayed by the amount of time that the TRIG__AVG signal is high. If the timer is not counting, i.e., the $\overline{INHIBIT}$ signal is high, then the TRIG__AVG signal has no effect on the timer.

This method of delaying the timer is used to ensure that the TRIG__TIMER signal will always be re-enabled, even if arcing starts while the timer is counting. Priority Level 1 arcing is intermittent in form, as there is not enough energy to sustain arcing for long periods. Therefore, even if Priority Level 1 arcing starts while the timer is counting, the counter will still be incremented during the gaps between arcing, and arc detection will be enabled at some time after arcing began. Thus, the timer circuit significantly reduces tripping due to the normal arcing generated by equipment and appliances, while ensuring that the GFCI/AFCI will eventually trip in the presence of arcs. Note that arcing at Priority Levels 2 and 3 is never disabled.

While the timer is counting, the $\overline{\text{INHIBIT}}$ signal is low, thus disabling the TRIG_TIMER signal. A light emitting diode (LED) 512 is connected to the output of the timer 506. The LED is also connected to the power supply $V_{CC}$ via a current limiting resistor 510. When the $\overline{\text{INHIBIT}}$ signal is low, the LED is lit indicating that arc detection has been temporarily disabled. When the $\overline{\text{INHIBIT}}$ signal is high the LED is extinguished indicating that arc detection is enabled.

Three signals combine to form the RESET signal: INH_A, INH_B and INH_C. These three signals are gated together through OR gate 508 to generate the RESET signal input to the RESET input of timer 506. Thus, INH_A, INH_B or INH_C going high will reset the timer. The three signals input to the OR gate 508 will now be described in more detail.

The timer can be reset by a user by pressing momentary push button switch 498. The INH_A signal, which is normally pulled low through resistor 500 tied to ground, is momentarily pulled active high. One alternative is to gang the switch 498 to the switch mechanism that provides the test pulse for the GFCI circuit. Arc detection is then disabled for a predetermined time period when the GFCI is tested. In other words, testing the GFCI before an appliance like a vacuum cleaner is used in the house will ensure that the device will not trip when the vacuum is used. Arc detection is automatically enabled a timer period after use of the arc generating appliance is disconnected.

As described previously, the output of the timer is normally high, allowing arc detection. One alternative is for the $\overline{\text{INHIBIT}}$ signal to go high immediately upon the power first being applied to the AFCI device. An alternative is for the timer to be reset upon power being applied. A third and preferred alternative is for the $\overline{\text{INHIBIT}}$ signal to be pulled low for a few AC cycles, e.g., 1 second, and then permitted allowed to go active high. It produces greater noise immunity, as the transients associated with the power being applied will be ignored by the AFCI circuitry. Moreover, the AFCI is not inhibited for a long period of time unnecessarily.

In situations where arc generating machinery is used throughout the day, such as in a factory with arc welding machinery, the detection of arc faults is only practical at night. Thus, the AFCI should be disabled during the day and enabled at night. A photoelectric cadmium selenide or cadmium sulfide photocell 522 is provided to inhibit Level 1 priority arc faults from tripping the device. The photocell 522 is connected to $V_{CC}$ via resistor 520. During daylight hours, the resistance of the photocell drops to a very low value, creating a low at the input to inverter 518. The output of the inverter INH_C goes high causing the RESET input of the timer to go high. This disables the TRIG_AVG signal from tripping the device. Conversely, at night or in the absence of light, the resistance of the photocell 522 rises to a high value causing the input to the inverter 518 to go high. The inverter output goes low, removing the INH_C signal, enabling the timer and permitting the arc detector to trip. Note that in the absence of light, the resistance of a cadmium selenide photocell may rise to 100 MΩ or more.

Figure 18:
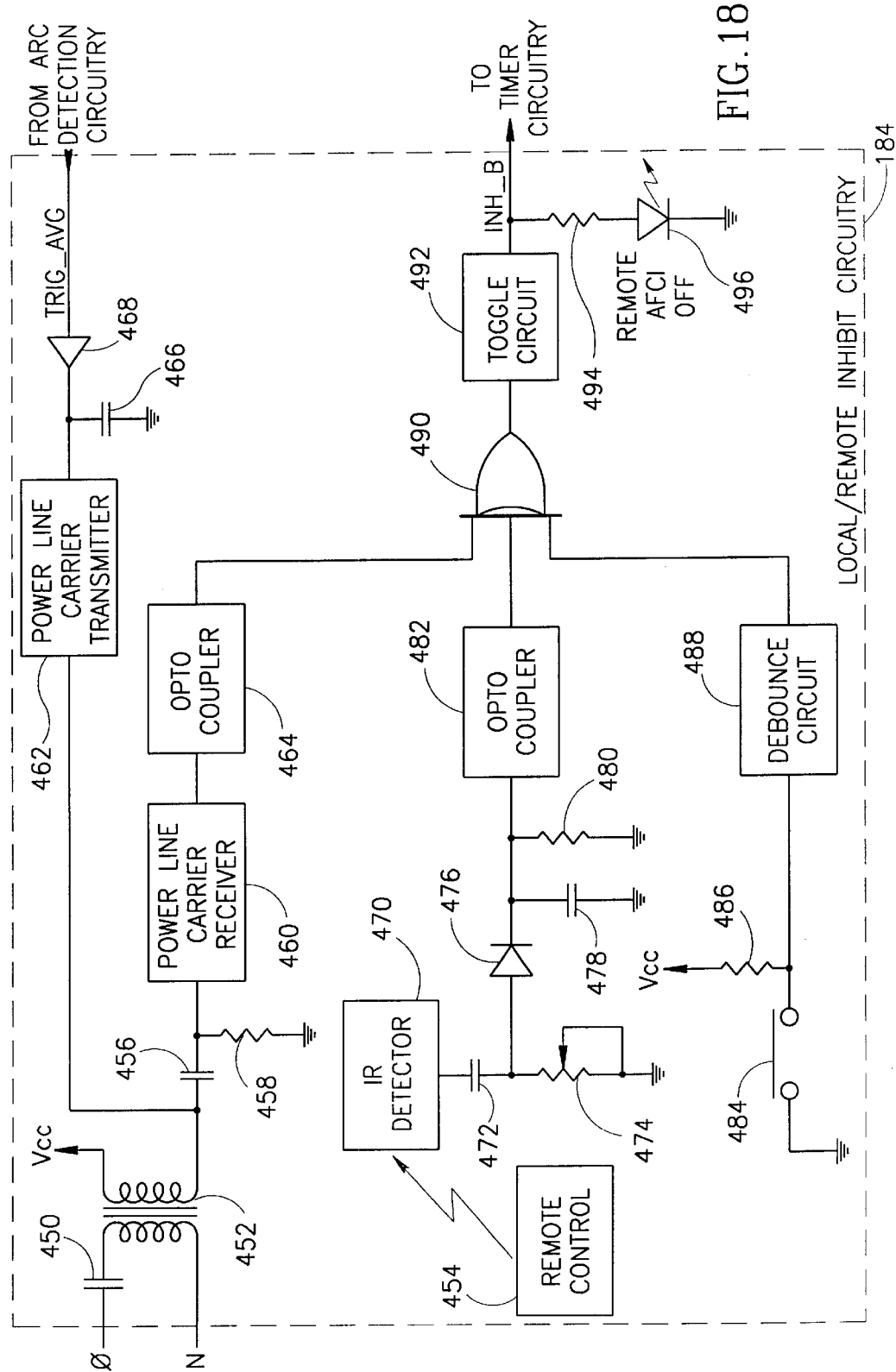
FIG. 18 is a schematic diagram illustrating the local/remote inhibit circuitry portion of the arc fault detection device of the present invention in more detail.

A third source, INH_B, for the RESET input is also input to the OR gate 514. This INH_B signal is generated by the local/remote inhibit circuitry which will now be described in more detail. A schematic diagram illustrating the local/remote inhibit circuitry portion of the arc fault detection device of the present invention in more detail is shown in FIG. 18. The local/remote inhibit circuitry 184 comprises circuitry that also inhibits the TRIG_AVG signal from tripping the device. The local/remote inhibit circuitry 184 can be constructed as an integral part of the AFCI/GFCI device or it can be constructed in its own external housing and connected to the main embodiment by a plurality of wires. The local/remote inhibit circuitry functions to turn the device on and off via momentary push button, turn the AFCI on and off via an infrared receiver, turn the AFCI on and off via a signal from an external communication source and send a signal, indicating the occurrence of an arc fault, to a remotely located receiver via any suitable communication means.

Infrared (IR) reception is achieved through IR detector 470 which may comprise an infrared diode which functions to pickup the pulsing signal from an IR transmitter 454. The transmitter may comprises a fixed transmitter or, in the alternative, any TV or stereo remote control that emits IR pulses modulated by a frequency in the range of 30 to 45 KHz. A receiving diode in the IR detector 470 changes its impedance upon reception of IR pulsing energy. The capacitor 472 passes these pulses through to resistor 474 while blocking DC. This limits the sensitivity of the device to any constant or slowly changing light level, e.g., daylight. The pulsating DC across pot 474 charges the capacitor 478 through diode 476. The resulting DC level is input to an opto coupler 482. Current flowing to the input of the opto coupler causes its output to go high. The output of the opto coupler is input to an OR gate 490. A high output of the opto coupler causes the output of the OR gate to go high.

The output of the OR gate 490 is input to a toggle circuit 492. The toggle circuit 492 operates in one of two alternative, user selected modes. In the first mode, the toggle circuit 492 functions to flip its output from low to high to high to low upon each low to high transistor of its input. In the second mode, the toggle circuit 492 functions to produce an active high pulse upon each low to high transition of its input.

The output of the toggle circuit 492 forms the INH_B signal, which is input to the OR gate 508 (FIG. 17). In the first toggle switch mode, the INH_B signal is held high until another input to the toggle circuit occurs. The arc detector is disabled until the local/remote inhibit circuitry releases the INH_B signal. In the second toggle switch mode, the INH_B pulse resets the timer but the AFCI is enabled automatically after the predetermined time period.

The status of the output of the local/remote inhibit circuit output is indicated via LED 496, which is connected to INH_B via resistor 494. In the first toggle switch mode, the lighted LED indicates that the AFCI is being disabled via remote means. In the second toggle switch mode, a flash of the LED 496 indicates that a reset pulse has been sent to the timer 506 (FIG. 17).

In addition, the circuitry 184 also comprises circuitry to enable a user to reset the timer or permanently disable the AFCI/GFCI device from a remote location. One end of momentary push button switch 484 is connected to ground and the other end is connected to a debounce circuit 488. The input to the debounce circuit 488 is help high by resistor 486 tied to $V_{CC}$. The output of the debounce circuit is input to OR gate 490. The debounce circuit functions to output a low while the switch 484 is open. When the switch is closed, the output of the debounce circuit 488 goes high causing the output of the OR gate 490 to go high, toggling the INH_B signal.

The local/remote inhibit circuitry 184 also comprises the capability to receive an on/off command via suitable communication means. For example, such communication means may comprise any power line carrier, RF, twisted pair or IR communication technology. An example of power line carrier communications include Lon Works and CEBus communications systems. By way of example only, the present invention incorporates a power line carrier receiver 460, such as the CCS receiver manufactured by Leviton Manufacturing, Little Neck, N.Y., which functions to receive a signal transmitted over the power line, decode and interpret the received command and output a signal to the opto coupler 464. The CCS power line carrier signal is modulated by a carrier of 121 KHz. This signal is extracted from the AC line through capacitor 450 and coupling transformer 452. The capacitor 456 and resistor 458 function to high pass filter the input to the receiver 460. The output of the opto coupler 464 is input to the OR gate 490. Thus, a high output of the opto coupler 464 causes the INH_B output of the toggle circuit 492 to change states. Without departing from the scope of the invention, other methods of communication such as those mentioned above can be utilized in place of the CCS system.

In addition, the present invention comprises communication means, e.g., power line carrier transmitter 462, to transmit arc fault information to a remotely located receiver, pinpointing the location of the fault. A dedicated indicator panel can be connected to the remote receiver where arc fault information is monitored by building personnel. This feature is desirable in industrial or commercial facilities, such as schools, supermarkets, etc. where the electrical system is centrally supervised.

The TRIG_AVG signal from the arc detection circuitry is input to buffer 468 whose output is smoothed via capacitor 466. The output of the buffer 468 is input to the transmitter 462 which functions to generate an output signal based on the state of TRIG_AVG. Though arcing may cease or be intermittent, the capacitor 466 maintains sufficient charge to keep the transmitter 462 activated long enough to transmit the required information through the AC line. The transmitter 462 comprises power transistor means to transfer the output of the transmitter onto the AC line via the line side phase and neutral terminals. Note that both the phase and neutral line connections and the indicator panel are located upstream of the AFCI/GFCI so that they are not disconnected in the event the device trips.

In addition, it is noted that even if the timer has been triggered, temporarily inhibiting the TRIG_AVG signal, the occurrence of an arc fault is nevertheless transmitted to the remote indicator via the transmitter 462. It is desirable to have an indication of an arc fault even if it is generated from equipment or appliances. Alternatively, the TRIG_TIMER signal can be input to the transmitter 462 thus preventing notification of arc faults while the $\overline{\text{INHIBIT}}$ signal is low.

As discussed previously, the arc detector of the present invention can be used a stand alone arc fault detector or combined with other types of circuit interrupting devices in addition to a GFCI. When used as a stand alone device, the AFCI/GFCI circuit of FIG. 7 is modified to include only arc fault related circuitry. In particular, one of the GFCI related transformers 233 and its related circuitry including the LM1851 IC 225 would be removed. The SCR trigger circuit 236 would need only four inputs, i.e., PULSE_EARLY_ARC, TRIG_EARLY_ARC, TRIG_ARC and TRIG_TIMER. The remainder of the circuit would remain, i.e., MOV, diode bride, coil, power supply, relay switches, etc.

While the invention has been described with respect to a limited number of embodiments, it will be appreciated that many variations, modifications and other applications of the invention may be made.

We claim:

1. An arc fault detector capable of being electrically connected to an electrical wiring system having a source of electric power comprising:
   indicating means for providing an indicia representing the presence of at least one arc fault condition in the electrical wiring system;
   trigger means, responsive to a trigger signal received after activation of the trigger means, for causing said indicating means to provide the indicia;
   means for activating said trigger means for a predetermined period of time when a voltage of the source of electrical power is below a predetermined value; and
   first arc fault detecting means for detecting a line impedance associated with the electrical wiring system after said activating means activates said trigger means, and for generating a line impedance signal when said detected line impedance is greater than a predetermined value with the line impedance signal being output as the trigger signal to the trigger means.

2. The device according to claim 1, wherein said line impedance trigger signal activates said trigger means.

3. The device according to claim 1, wherein said first arc fault detecting means comprises:
   a transformer through which phase and neutral conductors pass and a current splitter connected to the electrical wiring system such that a line impedance arc fault sense signal proportional to the current flowing through the electrical wiring system is generated by said transformer.

4. The device according to claim 3, wherein said current splitter comprises an impedance connected in parallel with said transformer.

5. The device according to claim 3, wherein said current splitter comprises a resistance connected in parallel with said transformer.

6. The device according to claim 3, wherein said current splitter comprises a reactance connected in parallel with said transformer.

7. The device according to claim 1, wherein said activating means activates said trigger means at a predefined interval.

8. The device according to claim 7, wherein said predefined interval is every half cycle of said source of electrical power.

9. The device according to claim 1, wherein said first arc fault detecting means generates as said line impedance trigger signal a pulse substantially proportional to the impedance of said electrical wiring system.

10. The device according to claim 1, wherein when activated said activating means loads an LC network across the source of electrical power, such that a pulse generated therefrom is indicative of a high impedance condition.

11. The device according to claim 1 further comprising a second arc fault detecting means for sensing a level of AC current flowing through an electrical load placed on said electrical wiring system, for generating peak and average high frequency signals, for generating peak and average AC line frequency signals, and for generating a signal level trigger signal in response to at least one of said peak high frequency signal, said average high frequency signal, said peak AC line frequency signal and said average AC line frequency signal.

12. The device according to claim 11, wherein said second arc fault detecting means comprises:
   current measurement means for sensing said level of AC current flowing through the load;

high frequency circuit means for generating said peak and average high frequency signals, wherein said peak high frequency signal corresponds to a peak level of high frequency current flowing through the load, and wherein said average high frequency signal corresponds to an average level of high frequency current flowing through the load;

AC line frequency circuit means for generating said peak and average AC line frequency signals, wherein said Peak AC line frequency signal corresponds to a peak level of AC line frequency current flowing through the load, and wherein said average AC line frequency signal corresponds to an average level of AC line frequency current flowing through the load; and means for generating said signal level trigger signal.

13. The device according to claim 2, wherein said means for generating said signal level trigger signal generates said signal level trigger signal when either said peak high frequency signal exceeds a predetermined threshold or said peak AC line frequency signal exceeds a predetermined threshold.

14. The device according to claim 12, wherein said means for generating said signal level trigger signal generates said signal level trigger signal when either said average high frequency signal exceeds a predetermined threshold or said average AC line frequency signal exceeds a predetermined threshold.

15. The device according to claim 12, wherein said means for generating said signal level trigger signal generates said signal level trigger signal after a time delay, said time delay being dependent upon a level of arcing detected or on said level of AC line current detected.

16. The device according to claim 12, wherein said means for generating said signal level trigger signal generates said signal level trigger signal based on a plurality of arc fault trip levels which are dependent on a magnitude of said average AC line current.

17. The device according to claim 12, wherein said means for generating said signal level trigger signal generates said signal level trigger signal based on a plurality of arc fault trip levels which are dependent on said level of AC line current detected.

18. The device according to claim 12, further comprising means for simultaneously detecting peak and average magnitudes of said high frequency current and said AC line current.

19. The device according to claim 11 further comprising means for at least partially disabling at least one of said first and second arc fault detecting means for a finite period of time to permit a user to use an electrical device exhibiting arcing, and for enabling said disabled arc fault detecting means after use of the electrical device exhibiting arcing has been discontinued.

20. The device according to claim 11, further comprising means for receiving an external disable command and disabling at least one of said first and second arc fault detecting means.

21. The device according to claim 11, further comprising means for manually disabling and enabling at least one of said first and second arc fault detecting means.

22. The device according to claim 11, further comprising means for disabling at least one of said first and second arc fault detecting means during daylight hours, and for enabling said at least one disabled arc fault detecting means during night hours.

23. The device according to claim 11, further comprising means for disabling and enabling at least one of said first and second arc fault detecting means in accordance with signals received from a remote transmitter.

24. The device according to claim 1, further comprising fault detection means for detecting a fault other than an arc fault, and for activating said trigger means when a fault other than an arc fault is detected.

25. The device according to claim 24, wherein said fault detection means comprises ground fault circuit interrupter means for detecting the occurrence of a ground fault, and for generating a ground fault trigger signal in response to the detection of a ground fault.

* * * * *